US009696496B2

(12) United States Patent
Masuyama et al.

(10) Patent No.: US 9,696,496 B2
(45) Date of Patent: Jul. 4, 2017

(54) SEMICONDUCTOR OPTICAL DEVICE AND SEMICONDUCTOR ASSEMBLY

(71) Applicant: SUMITOMO ELECTRIC INDUSTRIES, LTD., Osaka (JP)

(72) Inventors: Ryuji Masuyama, Kamakura (JP); Yoshihiro Yoneda, Isehara (JP); Hideki Yagi, Machida (JP); Kenji Sakurai, Kamakura (JP); Takehiko Kikuchi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/341,316

(22) Filed: Nov. 2, 2016

(65) Prior Publication Data

US 2017/0131473 A1    May 11, 2017

(30) Foreign Application Priority Data

Nov. 5, 2015    (JP) .................. 2015-217495

(51) Int. Cl.
*G02B 6/12*    (2006.01)
*G02B 6/293*    (2006.01)
(Continued)

(52) U.S. Cl.
CPC ..... *G02B 6/29344* (2013.01); *G02B 6/12004* (2013.01); *H01L 31/02005* (2013.01);
(Continued)

(58) Field of Classification Search
CPC ....... H01L 2924/00; H01L 2924/00014; H01L 2224/48091; G02B 6/43

See application file for complete search history.

(56) References Cited

U.S. PATENT DOCUMENTS

| 5,327,517 A | 7/1994 | Yamada et al. |
| 6,021,149 A | 2/2000 | Miyazaki et al. |

(Continued)

FOREIGN PATENT DOCUMENTS

| JP | H05/210029 | 8/1993 |
| JP | H06-331840 | 12/1994 |

(Continued)

OTHER PUBLICATIONS

Office Action issued Jan. 27, 2017 in U.S. Appl. No. 15/222,483.

(Continued)

*Primary Examiner* — Jennifer Doan
(74) *Attorney, Agent, or Firm* — Smith, Gambrell & Russell, LLP.

(57) ABSTRACT

A semiconductor optical device includes a semiconductor substrate having first to fourth regions, a 90-degree optical hybrid provided in the third region on a principal surface of the semiconductor substrate, first and second waveguides provided in the first region and being optically coupled to the 90-degree optical hybrid, a photodiode provided in the fourth region, a third waveguide provided in the second region to optically couple the 90-degree optical hybrid to the photodiode, and a metal layer provided on a back surface of the semiconductor substrate. The metal layer includes a first part provided in the first region and a second part provided in the second region that is spaced apart from the first part by a distance. The 90-degree optical hybrid has a first length. The distance between the first and second parts is more than or equal to the first length.

9 Claims, 21 Drawing Sheets

(51) Int. Cl.
  *H01L 31/0232*   (2014.01)
  *H01L 31/0304*   (2006.01)
  *H01L 31/109*    (2006.01)
  *H01L 31/02*     (2006.01)
  *H01L 31/18*     (2006.01)

(52) U.S. Cl.
  CPC .. *H01L 31/02327* (2013.01); *H01L 31/03046* (2013.01); *H01L 31/109* (2013.01); *H01L 31/1844* (2013.01)

(56) References Cited

U.S. PATENT DOCUMENTS

| | | | |
|---|---|---|---|
| 7,062,116 B2* | 6/2006 | Ouchi | G02B 6/1221 385/14 |
| 8,483,524 B2* | 7/2013 | Li | G02B 6/1221 385/14 |
| 9,366,835 B2 | 6/2016 | Masuyama et al. | |
| 2008/0187268 A1 | 8/2008 | Kaneko et al. | |
| 2010/0158436 A1 | 6/2010 | Riska | |
| 2010/0166427 A1 | 7/2010 | Jeong | |
| 2012/0070113 A1 | 3/2012 | Ishii | |
| 2012/0106984 A1 | 5/2012 | Jones et al. | |
| 2012/0328236 A1 | 12/2012 | Nasu et al. | |
| 2013/0330038 A1 | 12/2013 | Onishi | |
| 2014/0334775 A1 | 11/2014 | Konishi et al. | |
| 2015/0177457 A1 | 6/2015 | Kasahara et al. | |
| 2017/0031099 A1 | 2/2017 | Fujimura et al. | |

FOREIGN PATENT DOCUMENTS

| | | |
|---|---|---|
| JP | 2010-171922 | 8/2010 |
| JP | 2012-68399 | 4/2012 |
| JP | 2013-005014 | 1/2013 |
| JP | 2014-115416 | 6/2014 |

OTHER PUBLICATIONS

PCT/ISA/220 Notification of Transmittal of the International Search Report and the Written Opinion of the International Searching Authority, or the Declaration for PCT/JP2016/003527 dated Oct. 25, 2016.

PCT/ISA/210 International Search Report for PCT/JP2016/003527 dated Oct. 25, 2016.

PCT/ISA/237 Written Opinion of the International Searching Authority for PCT/JP2016/003527 date Oct. 25, 2016.

S. Farwell et al., "InP Coherent Receiver Chip with High Performance and Manufacturability for CFP2 Modules", OFC 2014, W1I.6.

\* cited by examiner

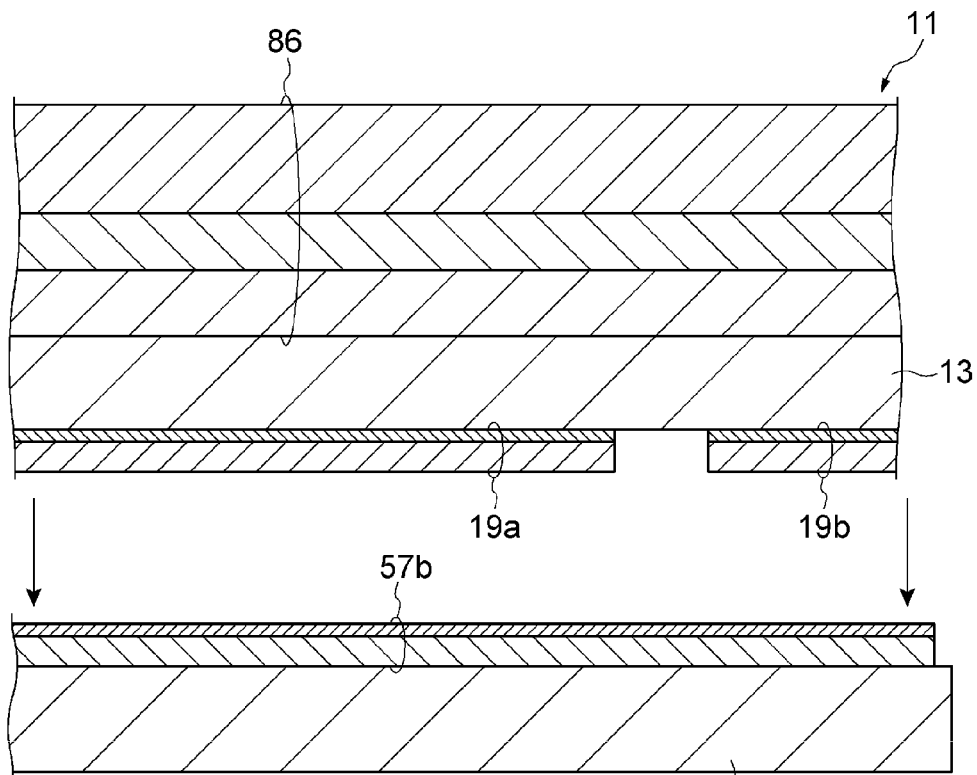
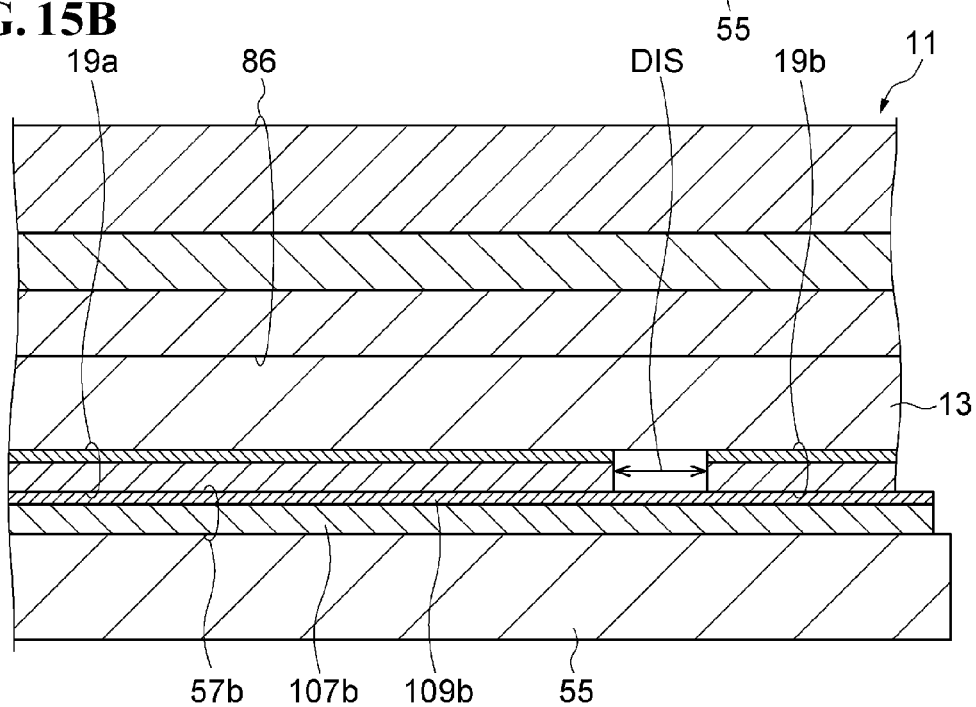

SEMICONDUCTOR OPTICAL DEVICE AND SEMICONDUCTOR ASSEMBLY

BACKGROUND OF THE INVENTION

1. Field of the Invention

The present invention relates to a semiconductor optical device and a semiconductor assembly.

2. Description of the Related Art

A semiconductor device including a 90-degree optical hybrid is disclosed in S. Farwell et al., "InP Coherent Receiver Chip with High Performance and Manufacturability for CFP2 Modules", Optical Fiber Communication Conference 2014, USA, OSA Technical Digest, W11.6 (March 2014).

A 90-degree optical hybrid includes a multi-mode interferometer (MMI) having waveguides provided on a semiconductor substrate. The 90-degree optical hybrid is optically coupled to a plurality of photodiodes by a plurality of waveguides. The characteristics of the multi-mode interferometer change depending on slight manufacturing variations. For this reason, in manufacture of the multi-mode interferometer, photolithography conditions, etching conditions, and other various technical items are adjusted. As a result of such adjustment, a 90-degree optical hybrid having desired performance is manufactured.

SUMMARY OF THE INVENTION

A semiconductor device including the 90-degree optical hybrid with the desired performance is die-bonded onto a carrier for a semiconductor assembly. In most cases, the characteristics of the semiconductor device after die-bonding deviate from desired characteristics. In particular, the imbalance between channels, among the characteristics of the 90-degree optical hybrid, is easy to change before and after die-bonding. The imbalance between channels refers to the difference in intensity of light to be sent toward a plurality of photodiodes (channels) by the 90-degree optical hybrid.

A semiconductor optical device according to an aspect of the present invention includes a semiconductor substrate having a first side edge and a second side edge extending in a direction of a first axis and including a first region, a second region, a third region, and a fourth region, a 90-degree optical hybrid provided in the third region on a principal surface of the semiconductor substrate, a first waveguide optically coupled to a first port of the 90-degree optical hybrid and provided in the first region on the principal surface of the semiconductor substrate, a second waveguide optically coupled to a second port of the 90-degree optical hybrid and provided in the first region on the principal surface of the semiconductor substrate, a photodiode provided in the fourth region on the principal surface of the semiconductor substrate, a third waveguide provided in the second region on the principal surface of the semiconductor substrate to optically couple a third port of the 90-degree optical hybrid to the photodiode, and a metal layer provided on a back surface of the semiconductor substrate and including a first part and a second part spaced from each other by a distance. The first region, the third region, the second region, and the fourth region are arranged in this order in the direction of the first axis. The first part of the metal layer is provided in the first region on the back surface of the semiconductor substrate, and the second part of the metal layer is provided in the second region on the back surface of the semiconductor substrate. The 90-degree optical hybrid has a first length defined in the direction of the first axis on the principal surface of the semiconductor substrate. The third region of the semiconductor substrate extends from the first side edge to the second side edge of the semiconductor substrate in in a direction of a second axis intersecting the first axis. A length of the third region of the semiconductor substrate is defined in the direction of the first axis and is equal to the first length. The distance between the first part and the second part is more than or equal to the first length.

A semiconductor assembly according to another aspect of the present invention includes the semiconductor optical device of the above aspect of the invention, a mount substrate having a mount surface and a metal film provided on the mount surface, and a bonding member that bonds the semiconductor optical device to the metal film of the mount substrate.

The above objects and further objects, features, and advantages of the present invention will more easily become apparent from the following detailed description of preferred embodiments with reference to the attached drawings.

BRIEF DESCRIPTION OF THE DRAWINGS

FIG. 15A schematically illustrates a main step in the method for manufacturing the semiconductor optical device of the embodiment.

FIG. 15B schematically illustrates a main step in the method for manufacturing the semiconductor optical device of the embodiment.

DESCRIPTION OF THE PREFERRED EMBODIMENTS

Figure 1:
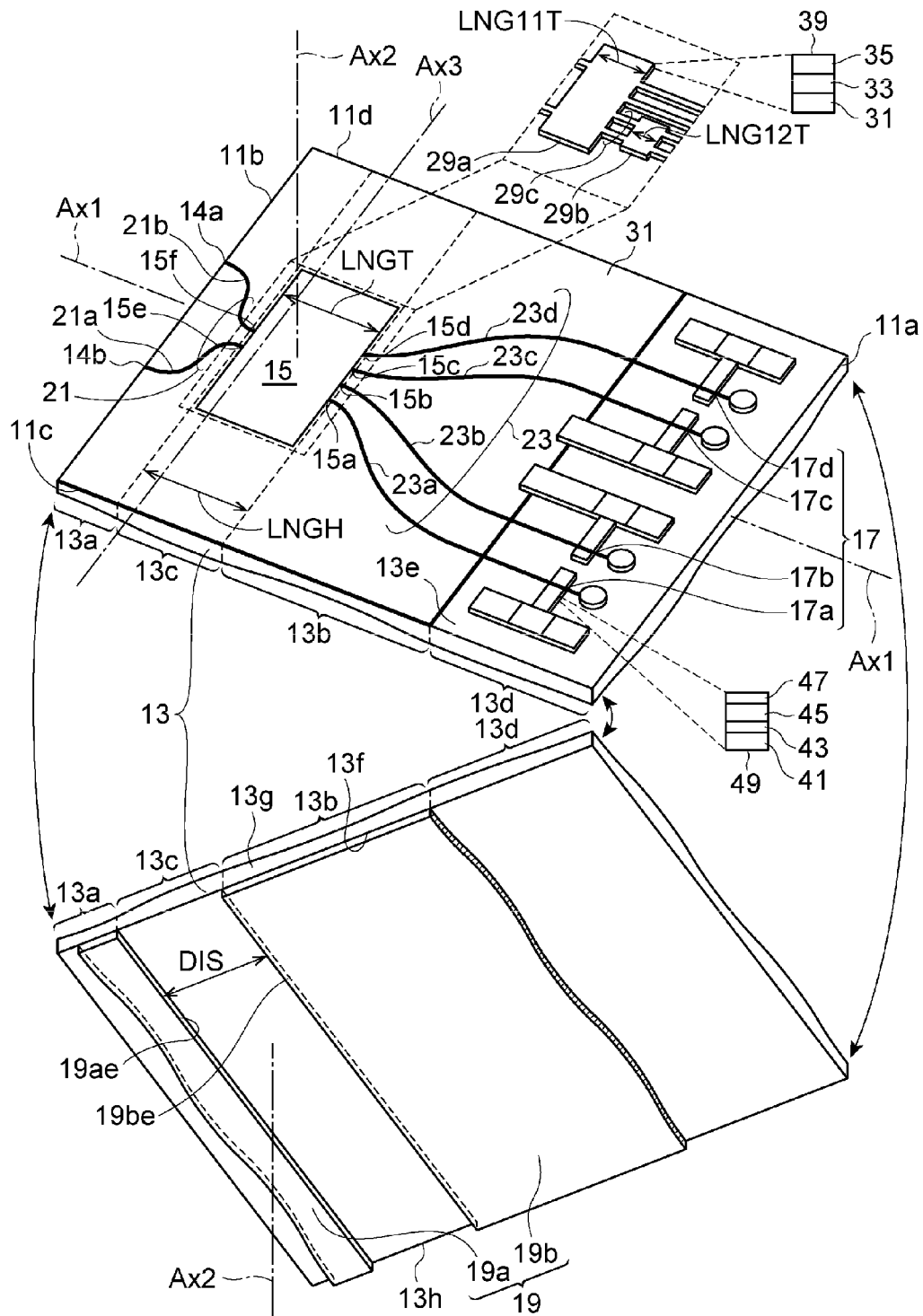
FIG. 1 schematically illustrates a semiconductor optical device according to an embodiment.

Next, some specific embodiments will now be described.

A semiconductor optical device according to an embodiment includes (a) a semiconductor substrate having a first side edge and a second side edge extending in a direction of a first axis and including a first region, a second region, a third region, and a fourth region, (b) a 90-degree optical hybrid provided in the third region on a principal surface of the semiconductor substrate, (c) a first waveguide optically coupled to a first port of the 90-degree optical hybrid and provided in the first region on the principal surface of the semiconductor substrate, (d) a second waveguide optically coupled to a second port of the 90-degree optical hybrid and provided in the first region on the principal surface of the semiconductor substrate, (e) a photodiode provided in the fourth region on the principal surface of the semiconductor substrate, (f) a third waveguide provided in the second region on the principal surface of the semiconductor substrate to optically couple a third port of the 90-degree optical hybrid to the photodiode, and (g) a metal layer provided on a back surface of the semiconductor substrate and including a first part and a second part spaced from each other by a distance. The first region, the third region, and the second region, and the fourth region are arranged in this order in the direction of the first axis. The first part of the metal layer is provided in the first region on the back surface of the semiconductor substrate, and the second part of the metal layer is provided in the second region on the back surface of the semiconductor substrate. The 90-degree optical hybrid has a first length defined in the direction of the first axis on the principal surface of the semiconductor substrate. The third region of the semiconductor substrate extends from the first side edge to the second side edge of the semiconductor substrate in a direction of a second axis intersecting the first axis. The third region in the semiconductor substrate has a length defined in the direction of the first axis equal to the first length. The distance between the first part and the second part is more than or equal to the first length.

According to this semiconductor optical device, the third region has the first length as the length defined in the direction of the first axis, and the 90-degree optical hybrid has the first length as the length defined in the direction of the first axis. The 90-degree optical hybrid is provided on the principal surface opposite from the back surface of the third region, and can include one or a plurality of multi-mode interferometers. The metal layer for die-bonding of the semiconductor optical device is provided on the back surface of the semiconductor substrate to avoid a location (place) of the multi-mode interferometer or interferometers in the 90-degree optical hybrid on the principal surface of the semiconductor substrate. Since the distance between an edge of the first part of the metal layer and an edge of the second part of the metal layer is more than or equal to the first length on the back surface of the semiconductor substrate, the first part and the second part of the metal layer are arranged on the back surface of the semiconductor substrate to be located on an outer side of the back surface of the third region on the back surface of the semiconductor substrate. According to this arrangement, it is possible to reduce the difference between the imbalance between channels before die-bonding of the semiconductor optical device and the imbalance between channels after die-bonding.

In the semiconductor optical device of the embodiment, the first part and the second part of the metal layer have their respective portions extending in the direction of the second axis from the first side edge to the second side edge of the semiconductor substrate.

According to this semiconductor optical device, the metal layer is not provided all over the back surface of the semiconductor substrate. However, since the first part and the second part of the metal layer extend in the direction of the second axis from the first side edge to the second side edge of the semiconductor substrate, the metal layer can be used to die-bond the semiconductor optical device.

In the semiconductor optical device of the embodiment, the 90-degree optical hybrid includes a first multi-mode interferometer and a second multi-mode interferometer. The first multi-mode interferometer is connected to the first waveguide and the second waveguide, and the second multi-mode interferometer is connected to the third waveguide. The first multi-mode interferometer and the second multi-mode interferometer are provided on the third region.

According to this semiconductor optical device, the first part and the second part of the metal layer on the back surface of the semiconductor substrate are arranged out of a back surface area opposite from the second region for the 90-degree optical hybrid on the principal surface on which the first multi-mode interferometer and the second multi-mode interferometer are mounted. The back surface area corresponding to the section of the principal surface where the first multi-mode interferometer and the second multi-mode interferometer are mounted does not have the metal layer, and therefore, is not die-bonded. In this arrangement, it is possible to prevent stress due to die-bonding of the back surface of the substrate from affecting the characteristics of the multi-mode interferometers provided on the principal surface of the substrate. This can reduce the difference between the imbalance between channels before die-bonding and the imbalance between channels after die-bonding in the 90-degree optical hybrid.

In the semiconductor optical device of the embodiment, the 90-degree optical hybrid further includes a fourth waveguide provided on the third region to optically couple the first multi-mode interferometer and the second multi-mode interferometer. The first multi-mode interferometer, the fourth waveguide, and the second multi-mode interferometer are arranged in order in the direction of the first axis. The metal layer further includes a third part spaced from the first part and the second part and provided on a back surface of the fourth waveguide. The third part is located between the first part and the second part on the back surface of the semiconductor substrate.

According to this semiconductor optical device, the third part of the metal layer is provided out of the arrangement position of the first multi-mode interferometer and the second multi-mode interferometer on the principal surface of the semiconductor substrate, and can be used for die-bonding.

In the semiconductor optical device of the embodiment, the first part and the second part of the metal layer have respective openings extending in the direction of the first axis, and the back surface of the semiconductor substrate is exposed in the openings.

According to this semiconductor optical device, openings extending in the direction of the first axis and the direction of the second axis to the side edges of the semiconductor optical device are provided on a section of the back surface corresponding to the position on the principal surface where the first multi-mode interferometer and the second multi-mode interferometer are mounted. The 90-degree optical hybrid has a first width defined in the direction of the second axis on the principal surface of the semiconductor substrate, and each of the first opening and the second opening has each width larger than the first width. The section of the back surface corresponding to the position on the principal surface where the first multi-mode interferometer and the second multi-mode interferometer are mounted is located in a region where the openings intersect. This arrangement can prevent stress due to die-bonding of the back surface of the substrate from affecting the characteristics of the multi-mode interferometers provided on the principal surface of the substrate. Thus, it is possible to reduce the difference between the imbalance between channels before die-bonding and the imbalance between channels after die-bonding in the 90-degree optical hybrid.

A semiconductor assembly according to another embodiment includes (a) a semiconductor optical device including a semiconductor substrate having first to fourth regions, a 90-degree optical hybrid provided in the third region on a principal surface of the semiconductor substrate, first and second waveguides provided in the first region on the principal surface of the semiconductor substrate optically coupled to the 90-degree optical hybrid, a photodiode provided in the fourth region on the principal surface of the semiconductor substrate, a third waveguide provided in the second region on the principal surface of the semiconductor substrate to optically couple a third port of the 90-degree optical hybrid to the photodiode, and a metal layer provided on a back surface of the semiconductor substrate and including a first part and a second part spaced from each other by a distance larger than a first length of the 90-degree optical hybrid, (b) a mount substrate having a mount surface and a metal film provided on the mount surface, and (c) a bonding member that bonds the semiconductor optical device to the metal film of the mount substrate.

According to this semiconductor assembly, the change in imbalance before and after mounting is small.

The teachings of the present invention can be easily understood in consideration of the following detailed description with reference to the attached drawings shown as examples. Next, a semiconductor optical device and a semiconductor assembly according to an embodiment will be described with reference to the attached drawings. If possible, the same components are denoted by the same signs.

FIG. 1 schematically illustrates a semiconductor optical device 11 according to the embodiment. In FIG. 1, the semiconductor optical device 11 is illustrated in such a way that both surfaces thereof are shown. The semiconductor optical device 11 includes a semiconductor substrate 13, a 90-degree optical hybrid 15, a photodetector 17, a metal layer 19, an input waveguide 21, and an output waveguide 23. The semiconductor substrate 13 includes a first region 13a, a second region 13b, a third region 13c, and a fourth region 13d. The first region 13a, the third region 13c, the second region 13b, and the fourth region 13d are arranged in a direction of a first axis Ax1. The semiconductor substrate 13 extends along a reference surface intersecting a second axis Ax2 that intersects the first axis Ax1. Also, the semiconductor substrate 13 has a first surface 13e (principal surface) and a second surface 13f (back surface). The first surface 13e and the second surface 13f respectively extend along a first reference surface and a second reference surface orthogonal to the second axis Ax2. The first surface 13e is located on an opposite side of the second surface 13f. The semiconductor substrate 13 further has a first side edge 13g and a second side edge 13h extending in the direction of the first axis Ax1. Waveguides 21a and 21b are provided in the first region on the principal surface of the semiconductor substrate 13, and waveguides 23a, 23b, 23c, and 23d are provided in the second region 13b on the principal surface of the semiconductor substrate 13. The 90-degree optical hybrid 15 is provided in the third region 13c on the principal surface of the semiconductor substrate 13, and is optically coupled to the photodetector 17. The photodetector 17 is provided in the fourth region 13d on the principal surface of the semiconductor substrate 13. The photodetector 17 receives optical signals from the 90-degree optical hybrid 15 through the waveguides 23a, 23b, 23c, and 23d and generates electric signals from the optical signals. In this embodiment, the photodetector 17 can include waveguide-type photodiodes 17a, 17b, 17c, and 17d. These photodiodes 17a, 17b, 17c, and 17d are optically coupled to the waveguides 23a, 23b, 23c, and 23d, respectively. The photodiodes 17a, 17b, 17c, and 17d are optically coupled to the waveguides 23a, 23b, 23c, and 23d via butt-joints.

The metal layer 19 includes a first part 19a and a second part 19b. The first part 19a and the second part 19b are provided on the back surface (second surface 130 of the semiconductor substrate 13. The first part 19a is provided in the first region 13a on the back surface (second surface 130 of the semiconductor substrate 13. The second part 19b is provided in the second region 13b on the back surface (second surface 130 of the semiconductor substrate 13. The 90-degree optical hybrid 15 has a first length LNGT defined in the direction of the first axis Ax1 on the principal surface (first surface 13e) of the semiconductor substrate 13. The third region 13c of the semiconductor substrate 13 extends from the first side edge 13g to the second side edge 13h of the semiconductor substrate 13 in a direction of a third axis Ax3 intersecting the first axis Ax1. A length LNGH of the third region 13c in the semiconductor substrate 13 is defined in the direction of the first axis Ax1, and is equal to the first length LNGT in the embodiment. The first part 19a and the second part 19b of the metal layer 19 are spaced from each other, and extend in the direction of the third axis Ax3. A distance DIS between an edge 19ae of the first part 19a and an edge 19be of the second part 19b is more than or equal to the first length LNGT. The thickness of the metal layer 19 can be, for example, 1 to 10 µm.

In the embodiment, the 90-degree optical hybrid 15 can include a first multi-mode interferometer 29a (for example, 2×4 MMI) and a second multi-mode interferometer 29b (for example, 2×2 MMI).

According to this semiconductor optical device 11, the third region 13c has the first length LNGT as the length defined in the direction of the first axis Ax1, and the 90-degree optical hybrid 15 has the first length LNGT as the length defined in the direction of the first axis Ax1. The 90-degree optical hybrid 15 is provided in the third region 13c on the principal surface (first surface 13e) opposite from the back surface (second surface 13f). The 90-degree optical hybrid 15 can include one or a plurality of multi-mode interferometers. The metal layer 19 for die-bonding of the semiconductor optical device 11 is provided on the back surface (second surface 130 of the semiconductor substrate 13 to avoid the location (place) of the multi-mode interferometer or interferometers in the 90-degree optical hybrid 15 on the principal surface (first surface 13e) of the semiconductor substrate 13. On the back surface (second surface 130 of the semiconductor substrate 13, the distance DIS between the edge 19ae of the first part 19a and the edge 19be of the second part 19b in the metal layer 19 is more than or equal to the first length LNGT. Hence, the first part 19a and the second part 19b are arranged on the back surface (second surface 130 of the semiconductor substrate 13 to be located on the outer side of the third region 13c on the back surface (second surface 130 of the semiconductor substrate 13. According to this arrangement, it is possible to reduce the difference between the imbalance between channels before bonding and the imbalance between channels after die-bonding in the semiconductor optical device 11.

In the embodiment, the first part 19a and the second part 19b of the metal layer 19 have respective portions extending from the first side edge 13g to the second side edge 13h of the semiconductor substrate 13 in the direction of the third axis Ax3, but do not extend onto the back surface of the third region 13c. The metal layer 19 can have one or a plurality of openings that separate the first part 19a and the second part 19b. In the semiconductor optical device 11, the metal layer 19 is not provided all over the back surface (second surface 130 of the semiconductor substrate 13. However, since the first part 19a and the second part 19b of the metal layer 19 extend from the first side edge 13g to the second side edge 13h of the semiconductor substrate 13 in the direction of the third axis Ax3, the metal layer 19 can be used for die-bonding of the semiconductor optical device 11.

In the embodiment, the 90-degree optical hybrid 15 performs demodulation for coherent optical communication. For that purpose, the semiconductor optical device 11 includes a first optical port 14a and a second optical port 14b. For example, the first optical port 14a receives coherent signal light phase-modulated to contain multi-level (for example, 4-level) data from the outside, and the second optical port 14b receives local oscillation light for demodulating the coherent signal light from the outside. A signal from the first optical port 14a is sent to a first port 15e of the 90-degree optical hybrid 15 via the waveguide 21a, and a signal from the second optical port 14b is sent as local oscillation light to a second port 15f of the 90-degree optical hybrid 15 via the waveguide 21b. The coherent signal light and the local oscillation light from these routes interfere with each other in the 90-degree optical hybrid 15. By this light interference, the 90-degree optical hybrid 15 demodulates the phase-modulated signal light into intensity-modulated signal light. The demodulated signal light is sent from a third port 15a, a fourth port 15b, a fifth port 15c, and a sixth port 15d of the 90-degree optical hybrid 15 to the waveguides 23a, 23b, 23c, and 23d. The waveguides 23a, 23b, 23c, and 23d optically couple the third port 15a, the fourth port 15b, the fifth port 15c, and the sixth port 15d of the 90-degree optical hybrid 15 to the photodiodes 17a, 17b, 17c, and 17d, respectively.

The semiconductor optical device 11 has a first edge 11a and a second edge 11b, and the first edge 11a and the second edge 11b extend in the direction of the third axis Ax3. In the embodiment, the photodiodes 17a, 17b, 17c, and 17d are arranged along the first edge 11a of the semiconductor optical device 11. At the second edge 11b, the first optical port 14a and the second optical port 14b are provided. The first edge 11a is located on an opposite side of the second edge 11b. The semiconductor optical device 11 also has a third edge 11c and a fourth edge 11d extending in the direction of the first axis Ax1.

For example, the semiconductor substrate 13 can be a semi-insulating semiconductor substrate. The semiconductor substrate 13 has a resistivity of $1 \times 10^7$ Ωcm or more. As the semiconductor substrate 13, for example, a Fe-doped InP substrate can be used. The Fe-doped InP substrate has an iron concentration, for example, within the range of $1 \times 10^{15}$ to $1 \times 10^{17}$ cm$^{-3}$. The thickness of the semiconductor substrate 13 can be, for example, 80 to 150 µm.

The 90-degree optical hybrid 15 can include an n-type semiconductor layer 31 serving as a first cladding layer, a core layer 33, and a second cladding layer 35. The n-type semiconductor layer 31, the core layer 33, and the second cladding layer 35 are arranged in order on the first surface 13e of the semiconductor substrate 13 in the normal direction of the first surface 13e to constitute a semiconductor laminate 39 for waveguides. The direction of the second axis Ax2 in FIG. 1 can be directed in this normal direction. The n-type semiconductor layer 31 extends out to both sides of the 90-degree optical hybrid 15 along the first region 13a, the second region 13b, and the third region 13c on the first surface 13e of the semiconductor substrate 13. In the semiconductor optical device 11, the n-type semiconductor layer 31 extends out from end portions of the 90-degree optical hybrid 15 along the first surface 13e of the semiconductor substrate 13. Between the n-type semiconductor layer 31 and the 90-degree optical hybrid 15, and the metal layer 19, the first region 13a, the second region 13b, and the third region 13c of the semiconductor substrate 13 are located. For example, the n-type semiconductor layer 31 can have a thickness of 500 to 2000 nm and an n-type dopant concentration of $1 \times 10^{17}$ to $1 \times 10^{19}$ cm$^{-3}$.

The photodetector 17 can include a cathode layer 41, a photo-absorption layer 43, an anode layer 45, and a contact layer 47. The cathode layer 41, the photo-absorption layer 43, the anode layer 45, and the contact layer 47 are arranged in order in the fourth region 13d on the first surface 13e of the semiconductor substrate 13 in the normal direction of the first surface 13e to constitute a semiconductor laminate 49 for the photodetector. The semiconductor laminate 49 forms a waveguide-type photodiode. The cathode layer 41 includes the n-type semiconductor layer 31. According to the semiconductor optical device 11, the photodetector 17 is provided as the waveguide-type photodiode on the semiconductor substrate 13. The waveguide-type photodiode allows the waveguides 23a to 23d extending from the 90-degree optical hybrid 15 to be optically coupled to the waveguide-type photodiode via butt-joints.

In the semiconductor optical device 11, the n-type semiconductor layer 31 reaches the edges of the first surface 13e of the semiconductor substrate 13 in the first region 13a, the second region 13b, and the third region 13c on the first surface 13e. In the embodiment, the n-type semiconductor layer 31 covers the first region 13a, the second region 13b, and the third region 13c on the first surface 13e. According to this semiconductor optical device 11, when the n-type semiconductor layer 31 is provided on the first surface 13e of the semiconductor substrate 13 to reach the edges of the first surface 13e, butt-joint structures can be easily formed to optically couple the semiconductor waveguides 23a to 23d of the 90-degree optical hybrid 15 to the photodetector 17.

Figure 2:
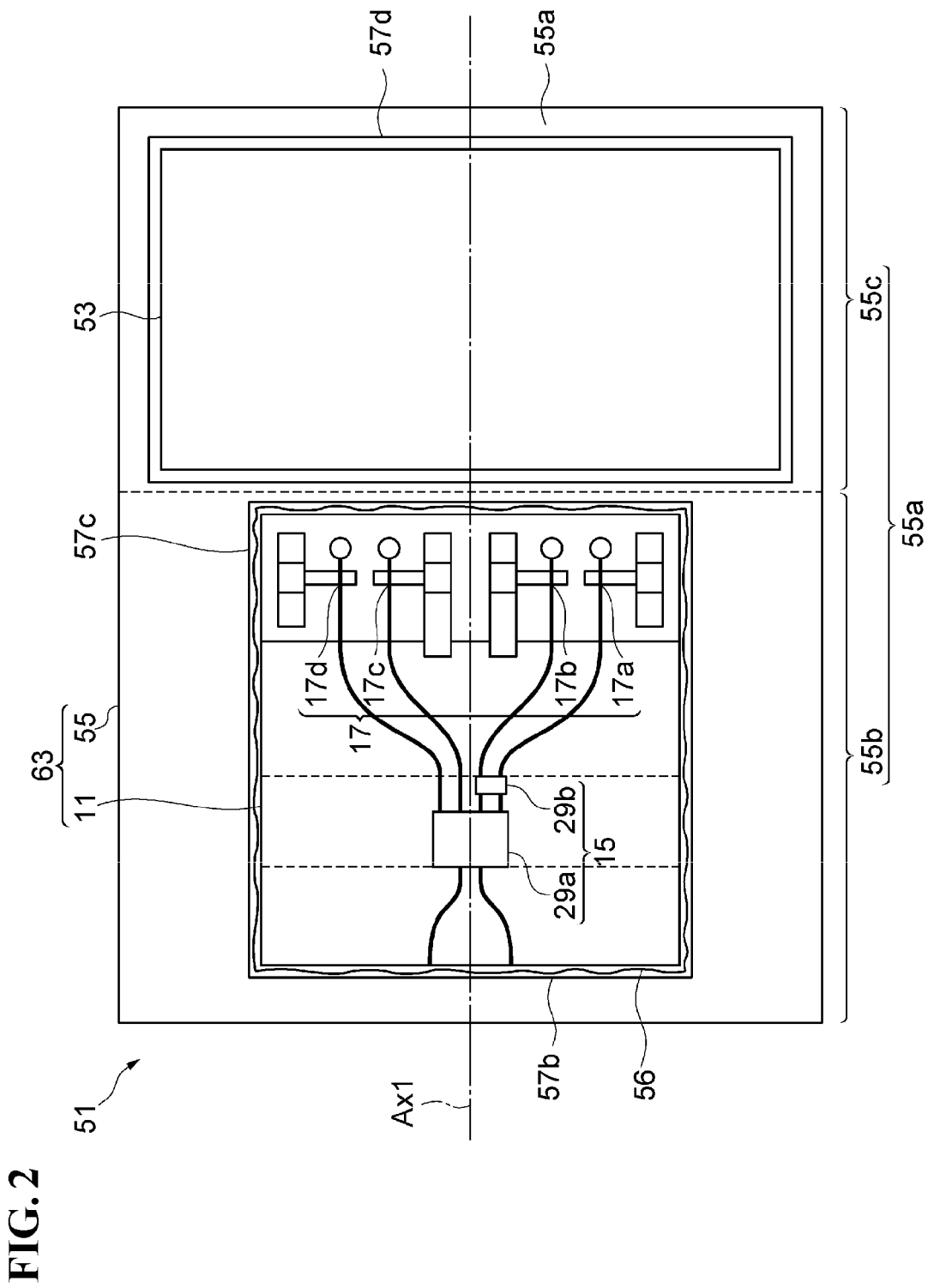
FIG. 2 schematically illustrates an optical device and a semiconductor assembly according to the embodiment.

FIG. 2 schematically illustrates an optical device 51 according to the embodiment. The optical device 51 includes the semiconductor optical device 11, a signal processing element 53, and a mount substrate 55. In the optical device 51, the semiconductor optical device 11 and the signal processing element 53 are mounted on the mount substrate 55. The signal processing element 53 processes electric signals from the photodetector 17 (photodiodes 17a to 17d) inside the semiconductor optical device 11. In the embodiment, the semiconductor optical device 11 and the signal processing element 53 are arranged on a principal surface 55a of the mount substrate 55 in the the direction of the first axis Ax1.

The principal surface 55a of the mount substrate 55 includes a first area 55b and a second area 55c. The first area 55b and the second area 55c are arranged in order in the direction of the first axis Ax1. The semiconductor optical device 11 is mounted on the first area 55b, and the signal processing element 53 is mounted on the second area 55c. The first area 55b of the mount substrate 55 has an electrode layer 57b for mounting the semiconductor optical device 11, and the second area 55c of the mount substrate 55 has an electrode layer 57d for mounting the signal processing element 53. On the principal surface 55a of the mount substrate 55, the electrode layer 57b is spaced from the electrode layer 57d. The semiconductor optical device 11 is joined onto the principal surface 55a of the mount substrate 55 by solder 56. In the embodiment, the first part 19a and the second part 19b are electrically connected by solder after this joining. A semiconductor assembly 63 includes the mount substrate 55, the semiconductor optical device 11 die-bonded to the electrode layer 57b of the mount substrate 55, and the solder 56 for die-bonding.

Figure 3:
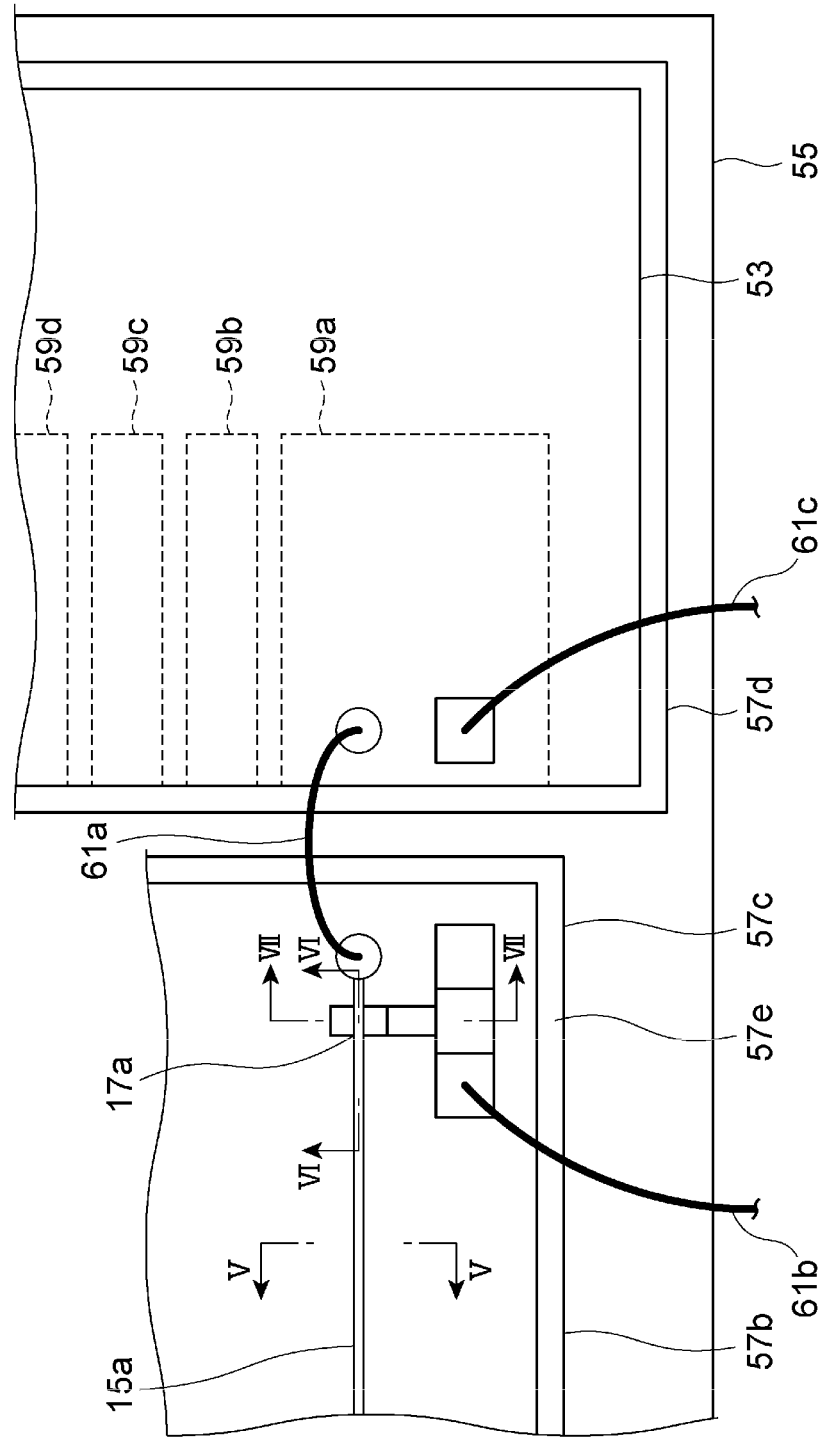
FIG. 3 is an enlarged view schematically illustrating connection between a semiconductor optical device and a signal processing element in the optical device according to the embodiment.

FIG. 3 is an enlarged view schematically illustrating connection between the semiconductor optical device 11 and the signal processing element 53 in the optical device 51 of the embodiment. The signal processing element 53 includes an amplifier 59a for the photodiode 17a of the semiconductor optical device 11, and further includes amplifiers 59b, 59c, and 59d. The amplifiers 59b, 59c, and 59d are respectively prepared for the photodiodes 17b, 17c, and 17d in the semiconductor optical device 11. The amplifiers 59a to 59d perform processing of electric signals from the semiconductor optical device 11, for example, amplification. The semiconductor optical device 11 is connected to the signal processing element 53 by, for example, a bonding wire 61a. To the semiconductor optical device 11, a cathode voltage is supplied from the signal processing element 53 through a bonding wire 61b. To the signal processing element 53, a reference voltage for the amplifiers is supplied from the outside through a bonding wire 61c. The multi-mode interferometers (MMI) in the 90-degree optical hybrid 15 generate intensity modulated light according to the phase difference of coherent signal light by utilizing the geometric shape of the semiconductor structures for the MMI. The photodetector 17 receives the intensity modulated light from the 90-degree optical hybrid 15, and generates a photocurrent in accordance with the light intensity. For example, an electric signal of the photocurrent is amplified by the amplifier 59a and is converted into a voltage signal by current-to-voltage (I/V) conversion.

Figure 4:
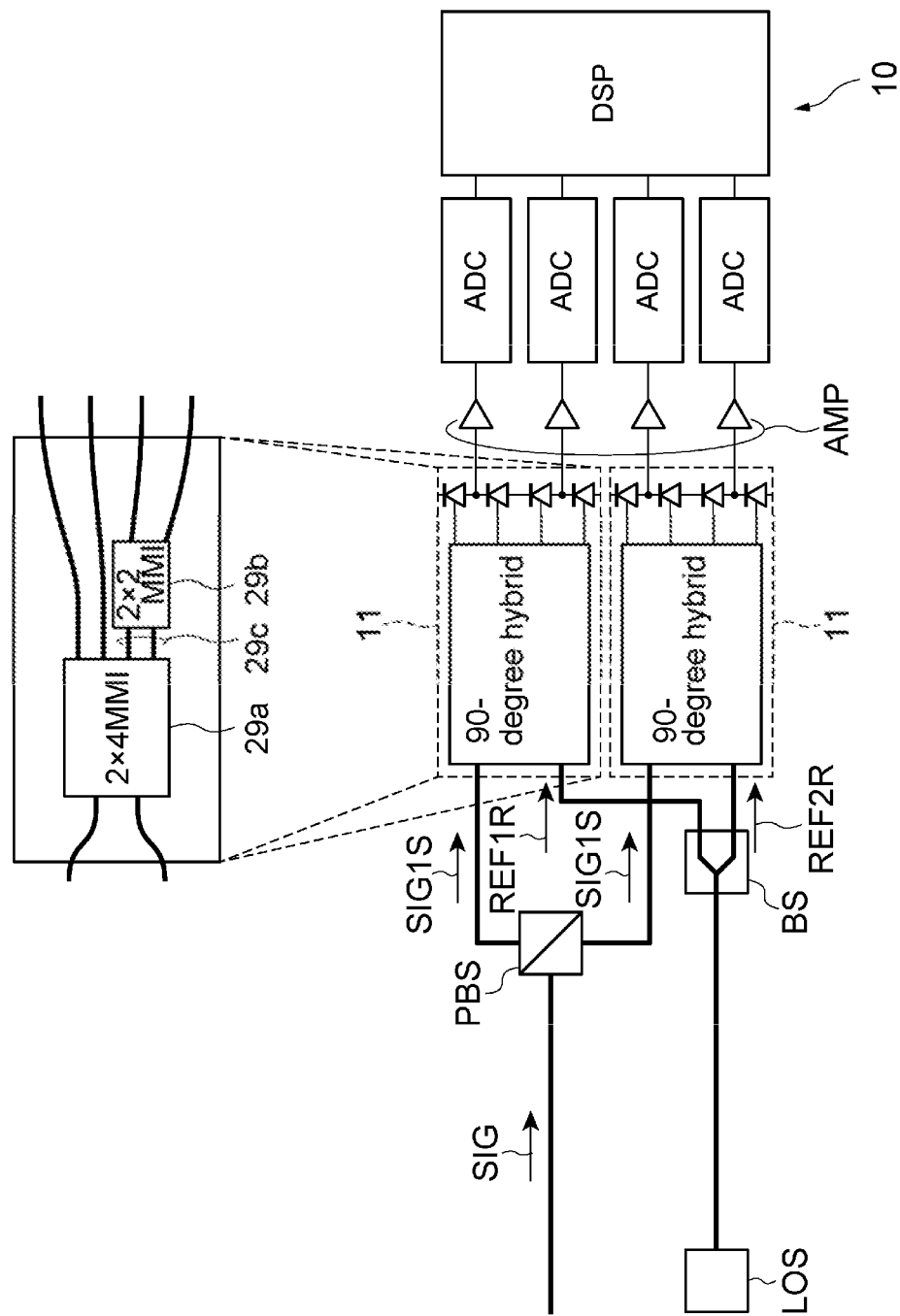
FIG. 4 schematically illustrates a coherent receiver including the semiconductor optical device of the embodiment.

FIG. 4 schematically illustrates a coherent receiver 10 including the semiconductor optical device 11 of the embodiment. The coherent receiver 10 includes a laser LOS for local oscillation light, a polarization beam splitter PBS, a beam splitter BS, two semiconductor optical devices 11, amplification circuits AMP, analog-to-digital (A/D) conversion circuits ADC, and a digital signal processing circuit DSP. The polarization beam splitter PBS splits coherent signal light SIG propagated through an external optical fiber into two signals SIG1S and SIG2S. These signals SIG1S and SIG2S are sent to the corresponding semiconductor optical devices 11. The laser LOS supplies local oscillation lights REF1R and REF2R to the semiconductor optical devices 11 via the beam splitter BS. The semiconductor optical devices 11 generate four interference lights by causing interference of coherent signal light and local oscillation light by the multi-mode interferometers. The four interference lights are intensity modulated signals lights. The four interference lights are converted into electric signals by the photodiodes. Each of the semiconductor optical devices 11 sends current signals according to the light intensity to the two amplification circuits AMP. The amplification circuits AMP convert the current signals into voltage signals. These analog voltage signals are converted into digital value sequences by the respective A/D conversion circuits ADC. These digital value sequences are demodulated into 4-level digital signals by the digital signal processing circuit DSP. The semiconductor optical devices 11 include their respective 90-degree optical hybrids. In the embodiment, each of the 90-degree optical hybrids includes, for example, a 2×4 multi-mode interferometer as a first multi-mode interferometer 29a and a 2×2 multi-mode interferometer as a second multi-mode interferometer 29b. Between the first multi-mode interferometer 29a and the second multi-mode interferometer 29b, a waveguide 29c is provided to optically couple the interferometers. The embodiment is not limited to this structure. For example, each 90-degree optical hybrid can include two 2×2 multi-mode interferometers and an intersection of two waveguides extending out from the 2×2 multi-mode interferometers.

Figure 5:
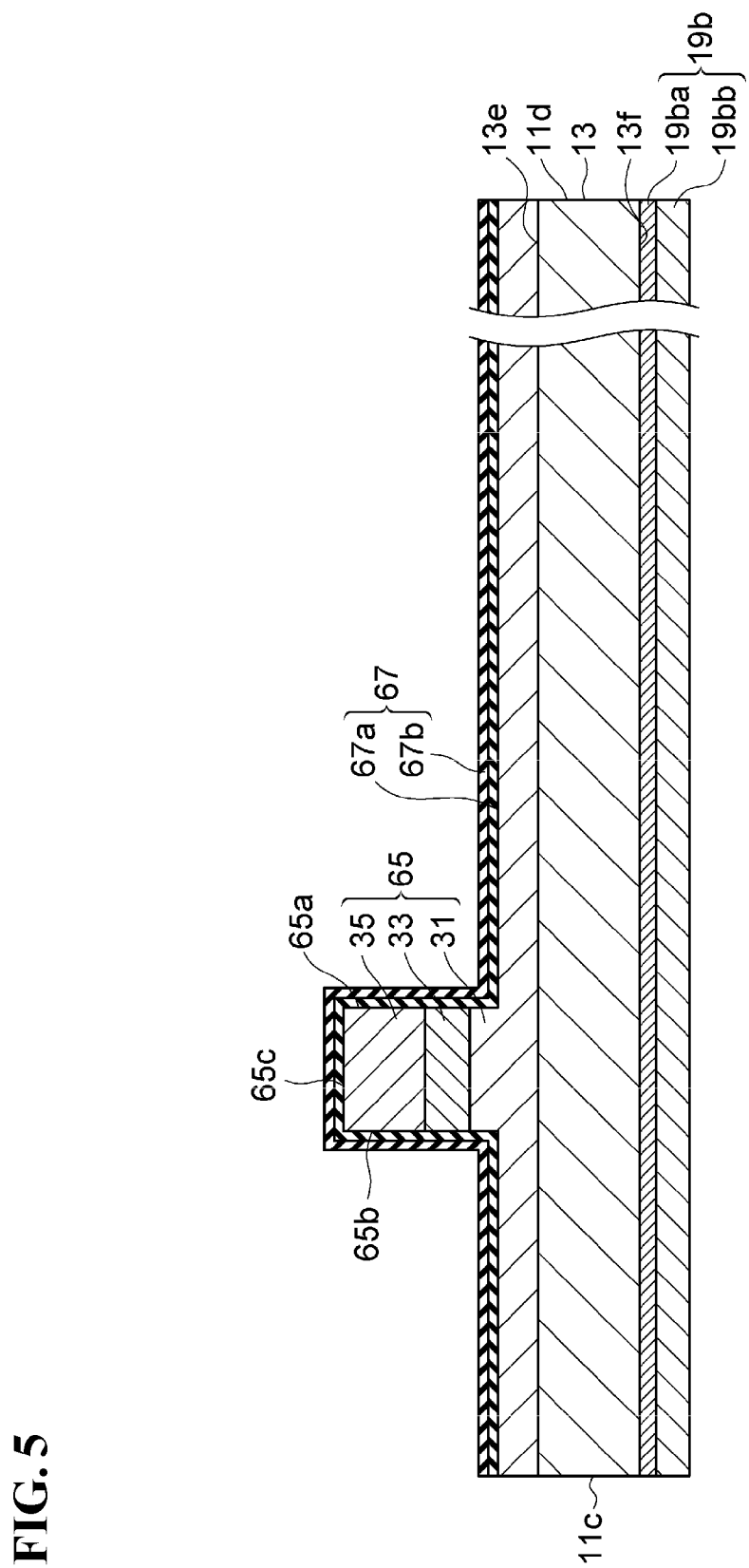
FIG. 5 is a cross-sectional view taken along line V-V of FIG. 3.

FIG. 5 is a cross-sectional view taken along line V-V of FIG. 3. A description will be given of a structure of an optical waveguide 65 that connects the 90-degree optical hybrid 15 to the photodetector 17. For example, the structure of the optical waveguide 65 can be applied to the waveguides 23a to 23d and the waveguides 21a and 21b. The optical waveguide 65 includes a first cladding layer 31 including an n-type semiconductor layer 31, a core layer 33, and a second cladding layer 35. The n-type semiconductor layer 31 is provided to cover the principal surface of the semiconductor substrate 13. The core layer 33 is provided on the n-type semiconductor layer 31, and the second cladding layer 35 is provided on the core layer 33. The refractive index of the core layer 33 is larger than the refractive indices of the n-type semiconductor layer 31 and the second cladding layer 35. An example of a semiconductor laminate for the optical waveguide 65 is given below.

Semiconductor substrate: semi-insulating InP substrate
n-type semiconductor layer 31 (first cladding layer): Si-doped InP
Core layer 33: InGaAsP with bandgap wavelength of 1.05 μm
Second cladding layer 35: undoped InP The optical waveguide 65 has a mesa structure, and includes a pair of side surfaces 65a and 65b that define the mesa structure. The pair of side surfaces 65a and 65b and an upper surface 65c of the mesa structure are covered with an insulating film 67. The insulating film 67 (insulating layers 67a and 67b in the embodiment) protects the mesa structure. The insulating layers 67a and 67b can be formed of, for example, a silicon-based inorganic compound (silicon nitride, silicon oxynitride, silicon oxide).

The n-type semiconductor layer 31 extends out from the pair of side surfaces 65a and 65b of the mesa structure, and, in the embodiment, reaches the edges of the first surface 13e of the semiconductor substrate 13 in the first region 13a, the second region 13b, and the third region 13c on the first surface 13e of the semiconductor substrate 13. Specifically, the n-type semiconductor layer 31 reaches the second edge 11b, the third edge 11c, and the fourth edge 11d on the first surface 13e of the semiconductor substrate 13. The second part 19b of the metal layer 19 is provided in the second region 13b on the second surface (back surface) 13f of the semiconductor substrate 13.

Figure 6:
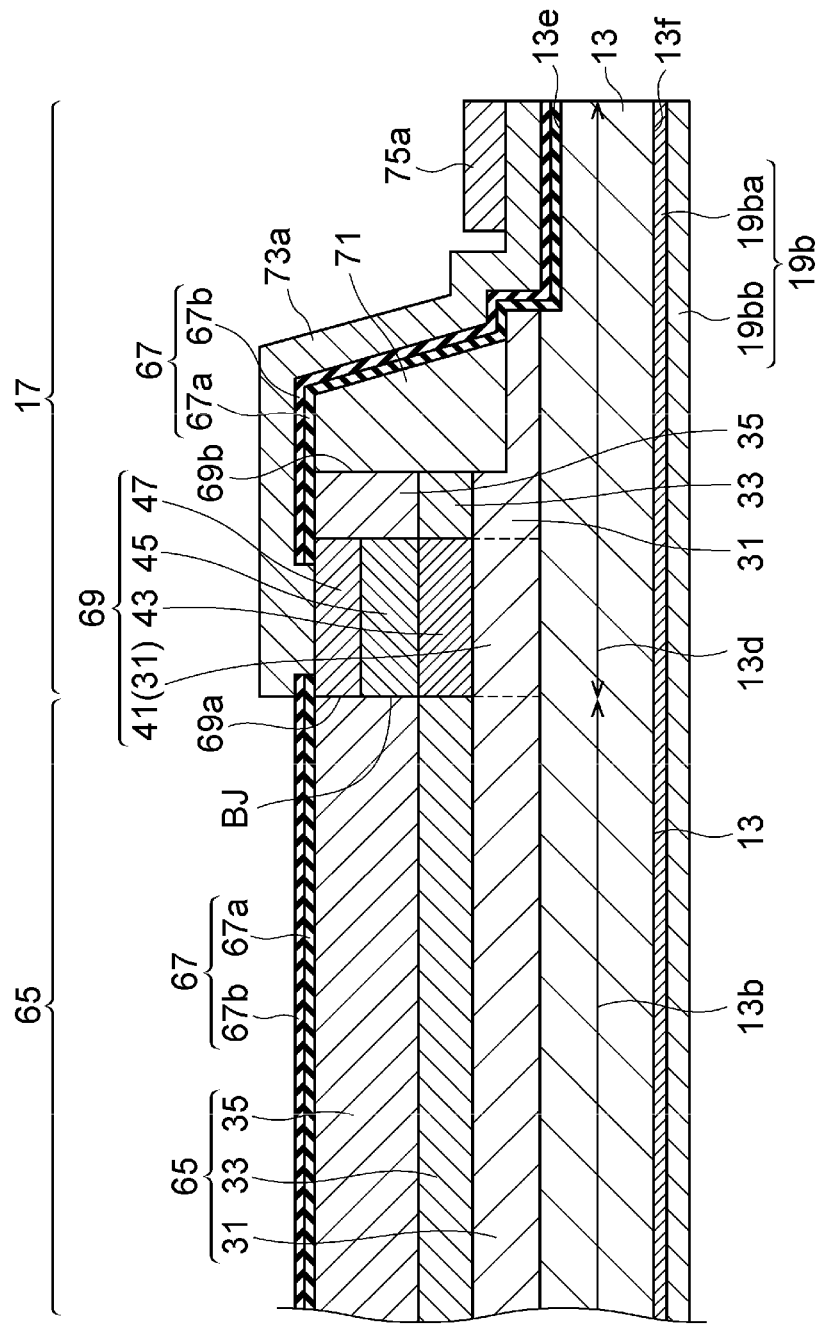
FIG. 6 is a cross-sectional view taken along line VI-VI of FIG. 3.
Figure 7:
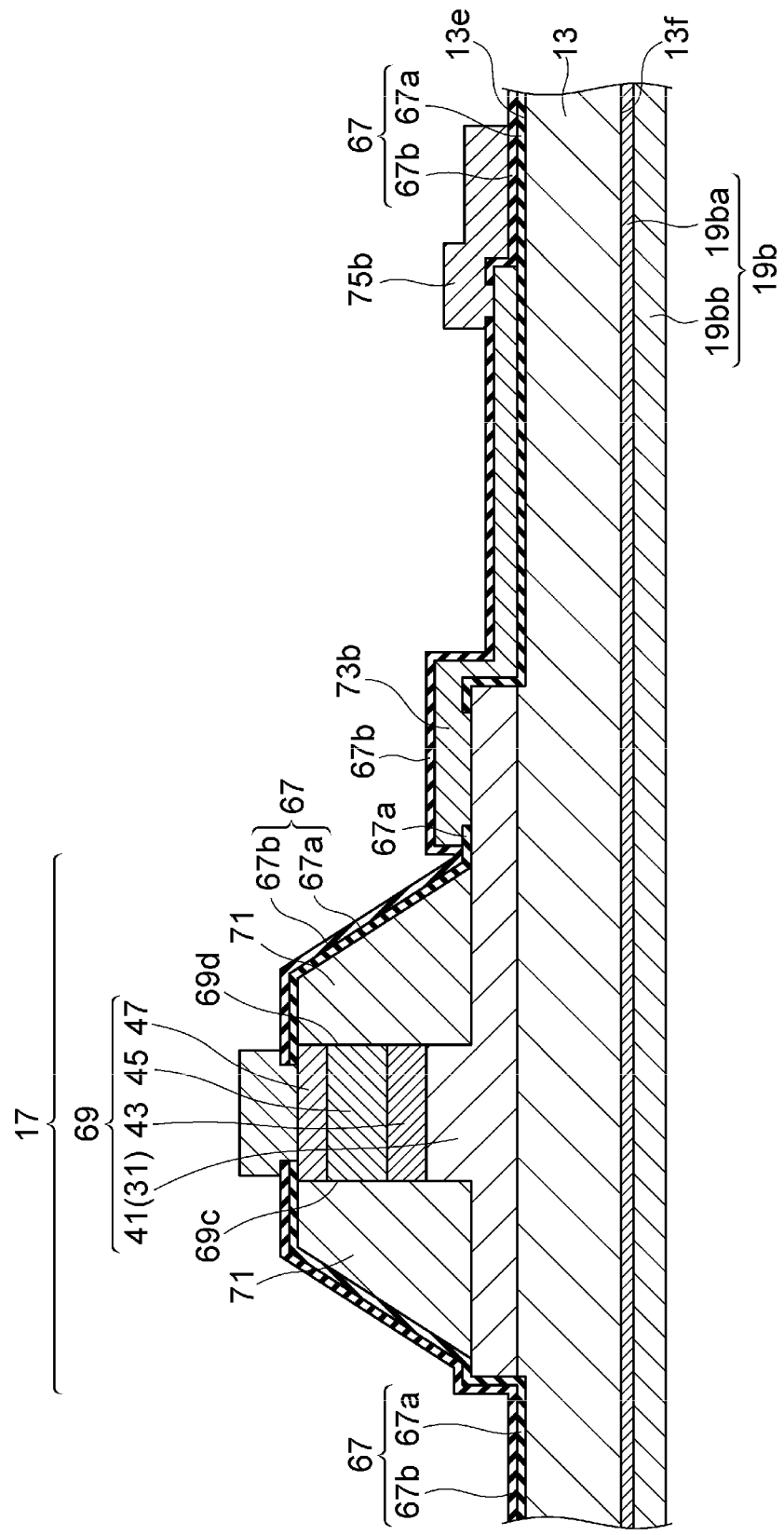
FIG. 7 is a cross-sectional view taken along line VII-VII of FIG. 3.

FIG. 6 is a cross-sectional view taken along line VI-VI of FIG. 3, and FIG. 7 is a cross-sectional view taken along line VII-VII of FIG. 3. FIG. 6 illustrates connection of the photodetector 17 and the optical waveguide 65, and FIG. 7 illustrates connection of the photodetector 17. The photodetector 17 includes a cathode layer 41, a photo-absorption layer 43, an anode layer 45, and a contact layer 47. The cathode layer 41 includes the n-type semiconductor layer 31. The cathode layer 41, the photo-absorption layer 43, the anode layer 45, and the contact layer 47 are arranged in order in the normal direction of the first surface 13e of the semiconductor substrate 13 in the fourth region 13d on the first surface 13e to constitute a waveguide-type photodiode. An example of a semiconductor laminate for the photodetector 17 is given below.

Cathode layer 41 (n-type semiconductor layer 31): Si-doped n-type InP
Photo-absorption layer 43: undoped InGaAs
Anode layer 45: Zn-doped p-type InP
Contact layer 47: Zn-doped InGaAs
Second part 19b (first part 19a) of metal layer 19: seed layer 19ba (19aa) and plating layer 19bb (19ab)

According to this semiconductor optical device 11, the photodetector 17 has the semiconductor laminate with a mesa structure. The photodetector 17 includes the waveguide-type photodiode provided on the semiconductor substrate 13. To the waveguide-type photodiode, the waveguides of the 90-degree optical hybrid 15 are optically coupled by a butt-joint structure (butt-joint structure BJ illustrated in FIG. 6). Specifically, after the first epitaxial growth is performed to produce a semiconductor laminate for the photodetector 17 on the semiconductor substrate 13, the semiconductor laminate is etched in an area for the 90-degree optical hybrid 15 to remove the photo-absorption layer 43, the anode layer 45, and the contact layer 47. After that, the second epitaxial growth is performed for a plurality of semiconductor layers that constitute the 90-degree optical hybrid 15 (for example, the core layer 33 and the second cladding layer 35). In this growth, the semiconductor laminate for the 90-degree optical hybrid 15 includes the n-type semiconductor layer 31 of the cathode layer 41 as a lower cladding layer. Since the n-type semiconductor layer 31 is also used in the optical waveguide 65, the 90-degree optical hybrid 15, and the photodetector 17, the growth thickness in the second epitaxial growth can be reduced. Thus, easiness of growth in the second epitaxial growth can be enhanced.

The semiconductor optical device 11 has the butt-joint structure BJ to connect one of the optical waveguide 65 and the photodetector 17 to the other. This butt-joint structure BJ is provided on one end surface 69a (and the other end surface 69b) of a mesa structure 69 of the photodetector 17. As illustrated in FIG. 7, other end surfaces 69c and 69d of the mesa structure 69 are buried in a buried region 71.

As illustrated in FIG. 6, the insulating film 67 has an opening provided in an upper surface of the mesa structure 69. This opening reaches the upper surface of the mesa structure 69 in the photodetector 17, and an anode electrode 73a is in contact with the contact layer 47 of the mesa structure 69 through the opening. The anode electrode 73a extends along the insulating film 67 that covers the buried region 71 on the side surface of the mesa structure 69, and is connected to a pad electrode 75a. For example, the anode electrode 73a is formed of AuZn or platinum (Pt), and the pad electrode 75a is formed of gold (Au).

In FIG. 7, the cathode layer 41 (n-type semiconductor layer 31) extends from the side surfaces of the mesa structure 69 to come out of covering with the buried region 71. An insulating layer 67a covers a protruding portion of the cathode layer 41 (n-type semiconductor layer 31) in contact therewith, and continuously extends from the insulating film 67 that covers the buried region 71 on the side surface of the mesa structure 69. On the insulating layer 67a at the cathode layer 41 (n-type semiconductor layer 31), a cathode electrode 73b is provided. The insulating layer 67a has an opening that reaches the cathode layer 41 (n-type semiconductor layer 31). In this opening, the cathode electrode 73b is in contact with the cathode layer 41 (n-type semiconductor layer 31). For example, the cathode electrode 73b is formed of AuGe or AuGeNi. The cathode electrode 73b extends to an area in the first surface 13e of the first interlayer connection conductor 13 across the edge of the cathode layer 41 (n-type semiconductor layer 31), and extends on the area in the first surface 13e of the semiconductor substrate 13. The cathode electrode 73b also extends on another area in the first surface 13e of the first interlayer connection conductor 13 across the edge of the cathode layer 41 (n-type semiconductor layer 31). In this area, the cathode electrode 73b is in contact with a pad electrode 75b through an opening provided in an insulating layer 67b. The pad electrode 75b is located on the insulating film 67.

Figure 8:
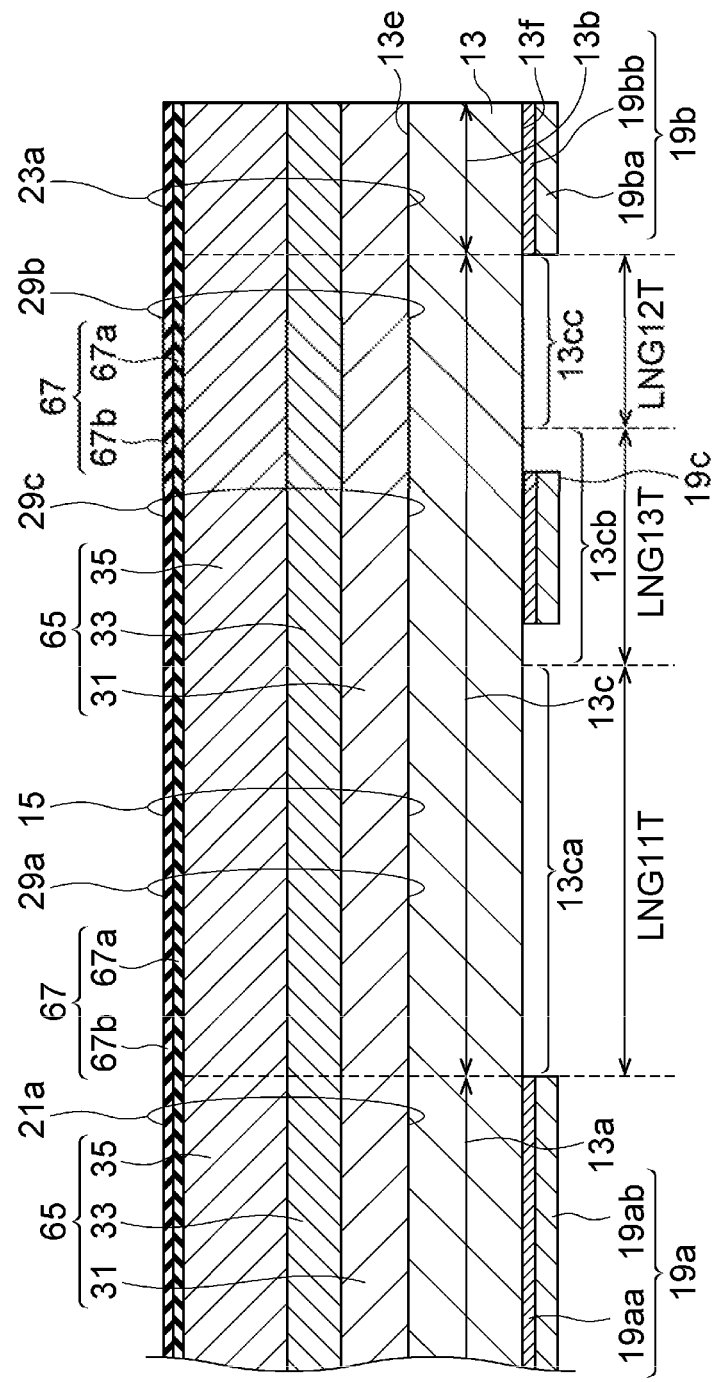
FIG. 8 illustrates a semiconductor waveguide structure and a 90-degree optical hybrid in the semiconductor optical device of the embodiment and a longitudinal cross section of the semiconductor waveguide structure.

FIG. 8 is a longitudinal sectional view of the waveguide 21a, the 90-degree optical hybrid 15, and the waveguide 23a, taken along the light guide axis. The waveguide 21a is mounted on the principal surface of the first region 13a, and the waveguide 23a is mounted on the principal surface of the second region 13b. The 90-degree optical hybrid 15 is mounted on the principal surface of the third region 13c between the first region 13a and the second region 13b. The first part 19a of the metal layer 19 is in contact with the back surface of the first region 13a, and the second part 19b of the metal layer 19 is in contact with the back surface of the second region 13b. The 90-degree optical hybrid 15 can include a first multi-mode interferometer 29a, a second multi-mode interferometer 29b, and a waveguide 29c that connects the first multi-mode interferometer 29a and the second multi-mode interferometer 29b. The first multi-mode interferometer 29a is connected to the waveguide 21a (21b), and the second multi-mode interferometer 29b is connected to the waveguide 23a (23b, 23c, 23d). The first multi-mode interferometer 29a and the second multi-mode interferometer 29b have a width that allows propagation of light of a multimode, and the waveguide 29c has a width that allows propagation of light of a single mode. The first multi-mode interferometer 29a, the second multi-mode interferometer 29b, and the waveguide 29c are provided on the third region 13c.

The third region 13c includes a first portion 13ca, a second portion 13cb, and a third portion 13cc arranged in order in the direction of the first axis Ax1. The first multi-mode interferometer 29a is provided on the first portion 13ca, and the second multi-mode interferometer 29b is provided on the third portion 13cc. The first portion 13ca has a width LNG11T ("width LNG11T" in FIG. 1) defined in the direction of the first axis Ax1, the third portion 13cc has a width LNG12T ("width LNG12T" in FIG. 1) defined in the direction of the first axis Ax1, and the second portion 13cb has a width LNG13T defined in the direction of the first axis Ax1. The waveguide 29c is provided on the second portion 13cb. The first portion 13ca, the second portion 13cb, and the third portion 13cc extend in the direction of the third axis Ax3 in FIG. 1 from the first side edge 13g to the second side edge 13h of the semiconductor substrate 13. According to this semiconductor optical device 11, the first part 19a and the second part 19b of the metal layer 19 are arranged on the back surface (second surface 130 of the semiconductor substrate 13 to be out of the entire area of the back surface opposite from the area of the principal surface (first surface 13e) of the third region 13c on which the first multi-mode interferometer 29a and the second multi-mode interferometer 29b for the 90-degree optical hybrid 15 are mounted. However, if necessary, the metal layer 19 can further include an additional part 19c (referred to as "third part 19c") spaced from the first part 19a and the second part 19b and provided on the back surface (second surface 130 of the second portion 13cb. The third part 19c is located between the first part 19a and the second part 19b of the metal layer 19 on the back surface (second surface 131) of the semiconductor substrate 13. The third part 19c of the metal layer 19 can be used for die-bonding. Since the third part 19c of the metal layer 19 is out of the arrangement position of the first multi-mode interferometer 29a and the second multi-mode interferometer 29b on the principal surface of the semiconductor substrate 13, even when it is used for die-bonding, stress due to die-bonding can be prevented from affecting the light interference characteristics of the first multi-mode interferometer 29a and the second multi-mode interferometer 29b.

Figure 9A:
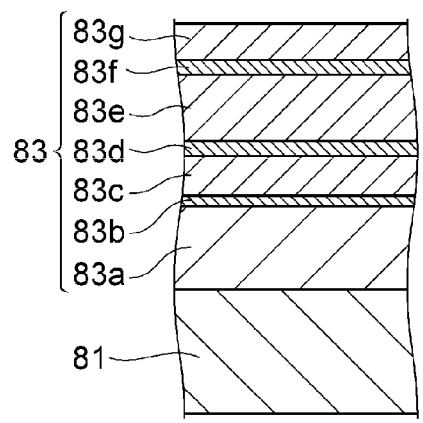
FIG. 9A schematically illustrates a main step in a method for manufacturing the semiconductor optical device of the embodiment.
Figure 9B:
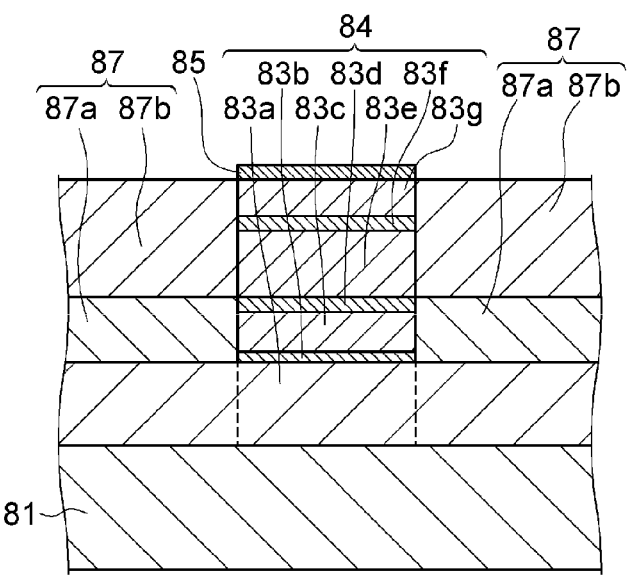
FIG. 9B schematically illustrates a main step in the method for manufacturing the semiconductor optical device of the embodiment.
Figure 9C:
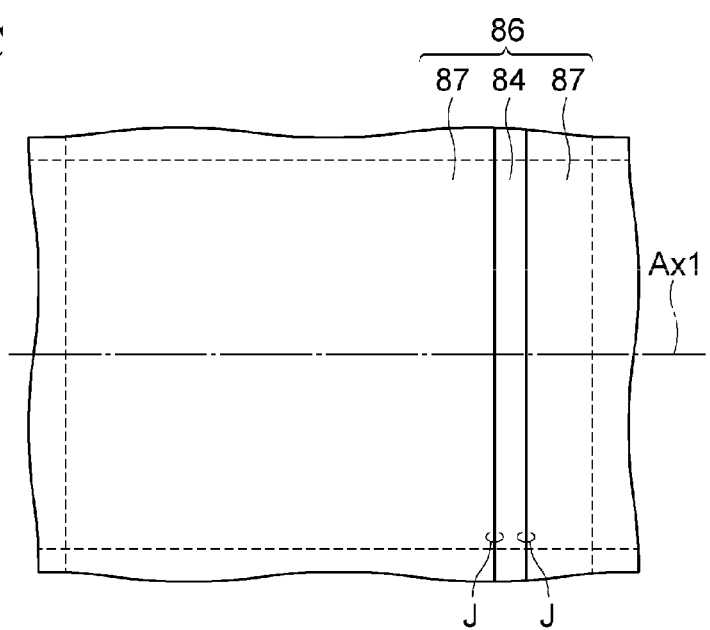
FIG. 9C schematically illustrates a main step in the method for manufacturing the semiconductor optical device of the embodiment.

FIGS. 9A to 9C to 15A and 15B schematically illustrate main steps in a method for manufacturing a semiconductor optical device. FIGS. 9A and 9B are cross-sectional views taken along the direction of the first axis Ax1 of FIG. 9C. FIG. 9C is a plan view of a semiconductor laminate including butt-joints J. As illustrated in FIG. 9A, a semiconductor laminate 83 to form photodiodes 17a to 17d is epitaxially grown on a semi-insulating InP wafer 81. Specifically, the semiconductor laminate 83 includes an n-type InP layer 83a, an n-type GaInAsP layer 83b, an InGaAs photo-absorption layer 83c, a p-type GaInAsP layer 83d, a p-type InP layer 83e, a p-type GaInAsP layer 83f, and a p-type InGaAs layer 83g. The n-type GaInAsP layer 83b, the p-type GaInAsP layer 83d, and the p-type GaInAsP layer 83f buffer a potential barrier formed on a hetero junction interface. FIG. 9B illustrates an insulating film mask 85 formed by photo-lithography. By etching the semiconductor laminate 83 using the insulating film mask 85, a stripe-like mesa structure 84 is formed in an area where photodiodes 17a to 17d are to be formed. The mesa structure 84 includes the n-type GaInAsP layer 83b, the InGaAs photo-absorption layer 83c, the p-type GaInAsP layer 83d, the p-type InP layer 83e, the p-type GaInAsP layer 83f, and the p-type InGaAs layer 83g. The n-type InP layer 83a is left on the entire wafer surface. While the n-type InP layer 83a grown in this first epitaxial growth step is left on the wafer 81, a core layer and an upper cladding layer for forming the optical waveguide are grown in a second epitaxial growth step. As illustrated in FIG. 9B, a semiconductor laminate is grown to form the optical waveguide 65 while the insulating film mask 85 is left. Specifically, a semiconductor laminate 87 including an InGaAsP core layer 87a and an undoped InP cladding layer 87b is epitaxially grown. Here, a part or all of the lower cladding layer also functions as a cathode layer grown as a semiconductor layer for the photodiodes 17a to 17d. When the insulating film mask 85 was removed, a semiconductor laminate 86 including butt-joints J was formed on the semi-insulating InP wafer 81 through these steps, as illustrated in FIG. 9C.

Figure 10A:
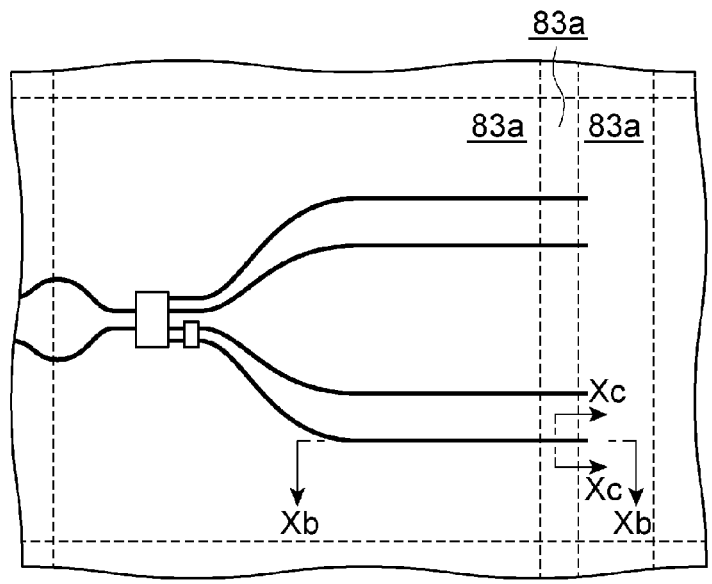
FIG. 10A schematically illustrates a main step in the method for manufacturing the semiconductor optical device of the embodiment.
Figure 10B:
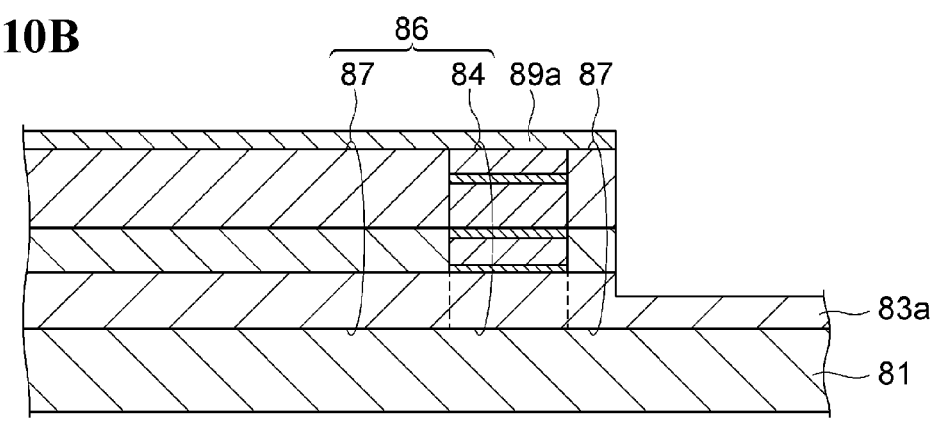
FIG. 10B schematically illustrates a main step in the method for manufacturing the semiconductor optical device of the embodiment.
Figure 10C:
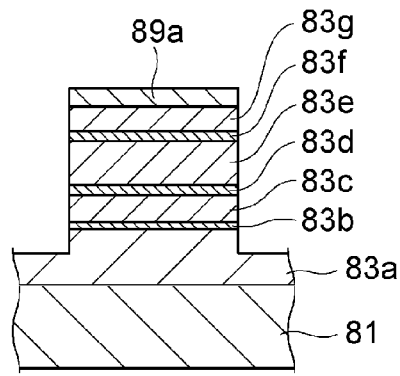
FIG. 10C schematically illustrates a main step in the method for manufacturing the semiconductor optical device of the embodiment.

By etching the semiconductor laminate 86, a waveguide 65 related to a 90-degree optical hybrid 15 and a mesa structure for the photodiodes 17a to 17d are formed. FIG. 10A is a plan view of a substrate product after etching, and illustrates an area corresponding to one semiconductor optical device. FIG. 10B is a cross-sectional view taken along line Xb-Xb of FIG. 10A, and FIG. 10C is a cross-sectional view taken along line Xc-Xc of FIG. 10A. As illustrated in FIGS. 10A and 10B, a mask 89a for etching is formed on the semiconductor laminate 86 by photolithography. The mask 89a has a pattern that defines the multimode waveguide structure for the 90-degree optical hybrid 15, the optical waveguide 65 connected to the 90-degree optical hybrid 15, and the mesa structure for the photodiodes 17a to 17d. For example, the mask 89a is formed of SiN. For example, etching includes dry etching.

Figure 11A:
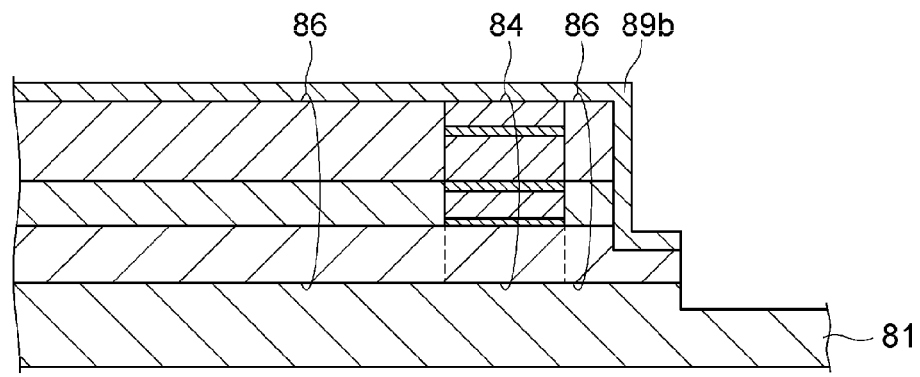
FIG. 11A schematically illustrates a main step in the method for manufacturing the semiconductor optical device of the embodiment.
Figure 11B:
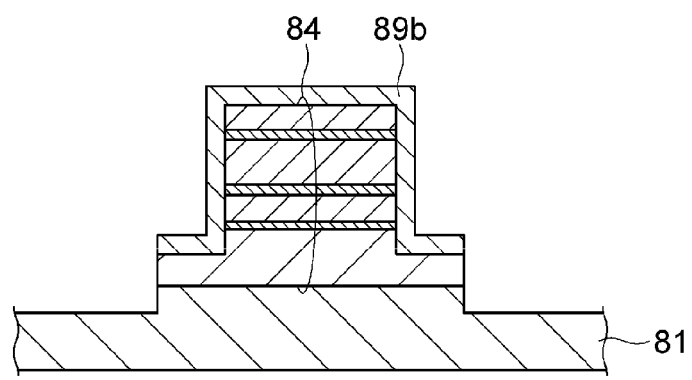
FIG. 11B schematically illustrates a main step in the method for manufacturing the semiconductor optical device of the embodiment.
Figure 11C:
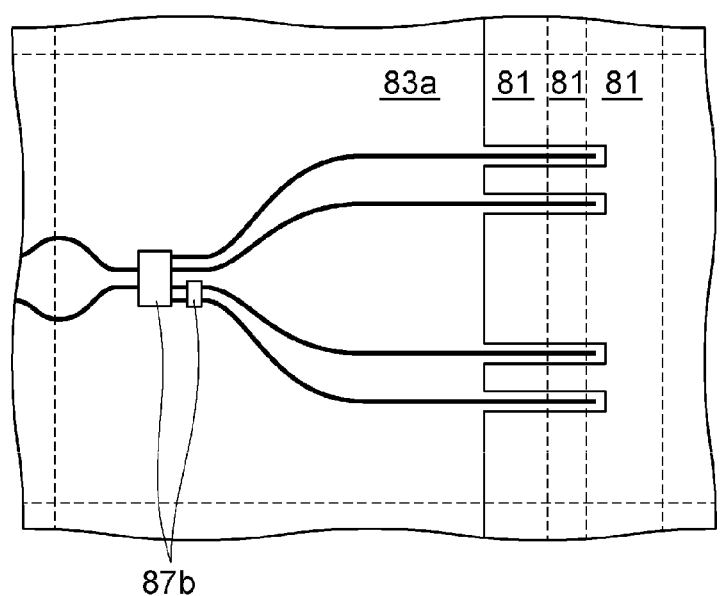
FIG. 11C schematically illustrates a main step in the method for manufacturing the semiconductor optical device of the embodiment.

The mask 89a is removed after etching. After that, cathode electrodes of the individual photodiodes are separated by etching the n-type InP layer 83a. FIGS. 11A and 11B illustrate progresses in the steps illustrated in the cross-sectional views of FIGS. 10B and 10C. As illustrated in FIGS. 11A and 11B, a mask 89b covering the optical waveguide 65 related to the 90-degree optical hybrid 15 and the mesa structure for the photodiodes 17a to 17d is formed by photolithography and etching. For example, the mask 89b is formed of SiN. The n-type InP layer 83a is etched by using the mask 89b. The semi-insulating InP wafer 81 is exposed in an area from which the n-type InP layer 83a is removed by this etching. FIG. 11C is a plan view of a substrate product after etching using the mask 89b, and illustrates an area corresponding to one semiconductor optical device. On a surface of the substrate product illustrated in FIG. 11C, the n-type InP layer 83a and the semiconductor structure of FIGS. 11A and 11B are shown. After etching, the mask 89b is removed.

Figure 12A:
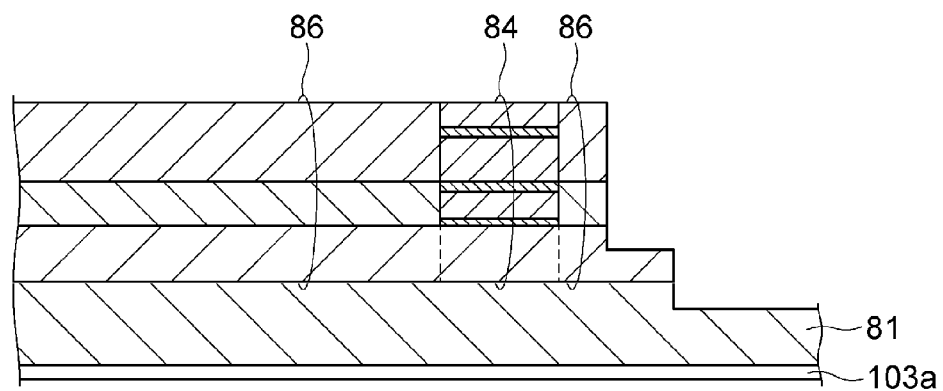
FIG. 12A schematically illustrates a main step in the method for manufacturing the semiconductor optical device of the embodiment.
Figure 12B:
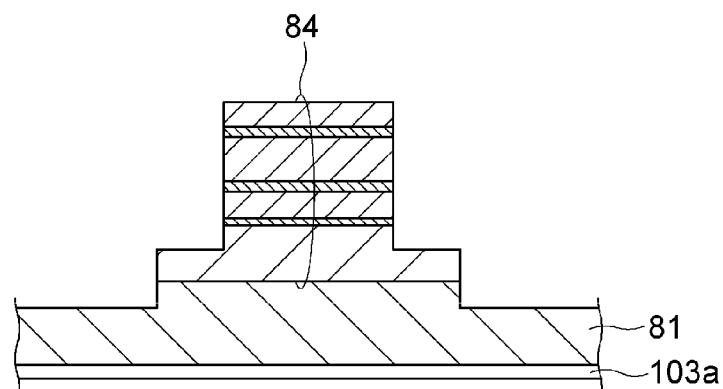
FIG. 12B schematically illustrates a main step in the method for manufacturing the semiconductor optical device of the embodiment.
Figure 13A:
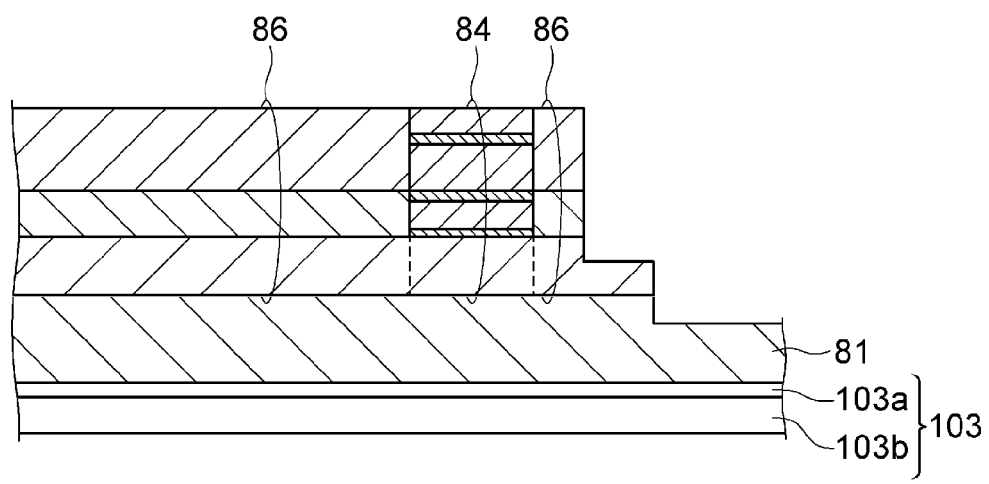
FIG. 13A schematically illustrates a main step in the method for manufacturing the semiconductor optical device of the embodiment.
Figure 13B:
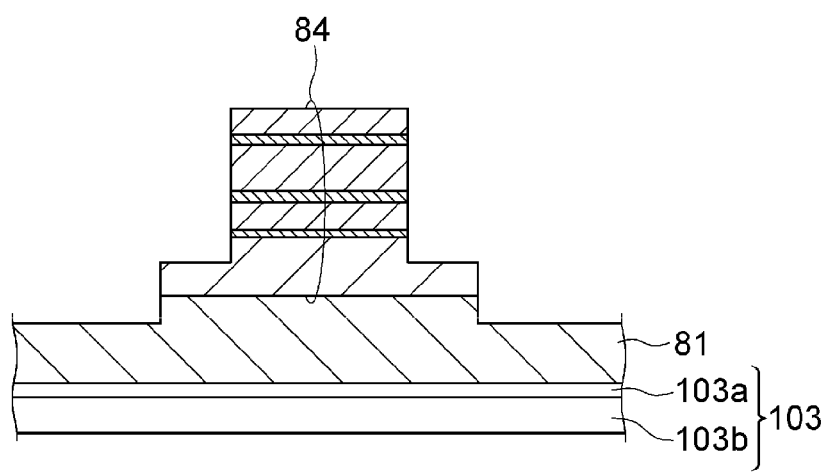
FIG. 13B schematically illustrates a main step in the method for manufacturing the semiconductor optical device of the embodiment.

Subsequently, a description will be given of a step of forming a metal film on a back surface of the semi-insulating InP wafer 81 and patterning the metal film. FIGS. 12A and 12B illustrate progresses from the steps illustrated in the cross-sectional views of FIGS. 11A and 11B. As illustrated in FIGS. 12A and 12B, a seed layer 103a is deposited on the back surface of the semi-insulating InP wafer 81. For example, the seed layer 103a includes a platinum (Pt) layer and a gold (Au) layer obtained by a sputtering method, and is deposited on the entire back surface. FIGS. 13A and 13B illustrate progresses from the steps illustrated in the cross-sectional views of FIGS. 12A and 12B. As illustrated in FIGS. 13A and 13B, a gold layer 103b is grown by plating on the seed layer 103a that covers the entire back surface. Through these steps, a conductive back-surface metal layer 103 covering the back surface of the semi-insulating InP wafer 81 is formed. When the back surface of the semi-insulating InP wafer 81 has irregularities, the back-surface metal layer 103 covers the irregularities on the back surface.

Figure 14A:
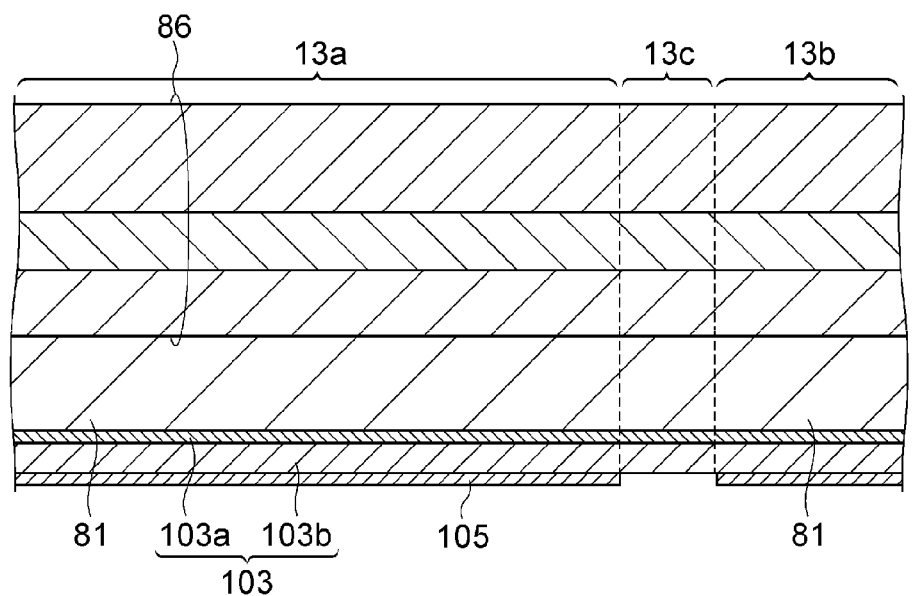
FIG. 14A schematically illustrates a main step in the method for manufacturing the semiconductor optical device of the embodiment.
Figure 14B:
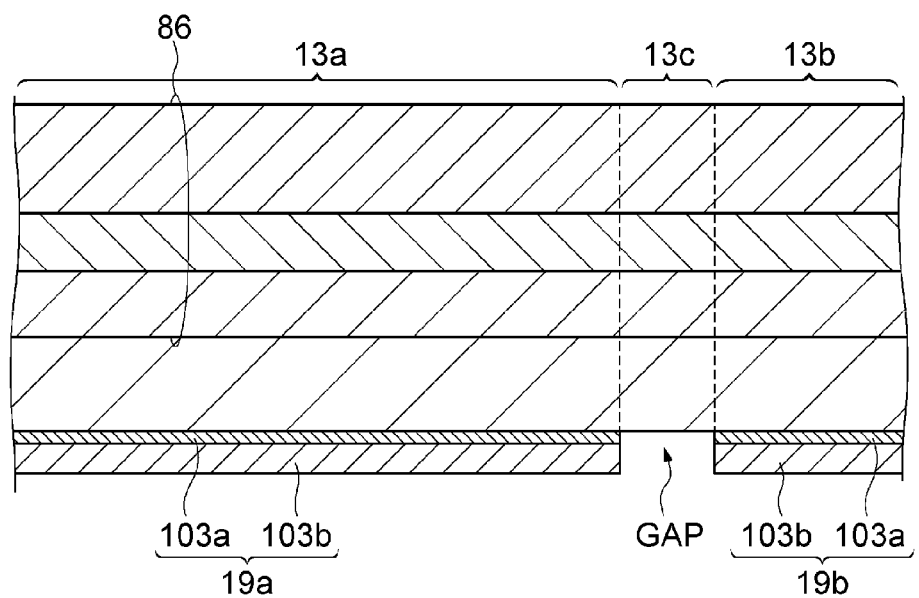
FIG. 14B schematically illustrates a main step in the method for manufacturing the semiconductor optical device of the embodiment.

FIGS. 14A and 14B are cross-sectional views illustrating a series of steps for isolating the back-surface metal layer 103. These cross sections are taken along the direction of the first axis Ax1 of FIG. 1 in a section of the substrate product including a first region 13a, a second region 13b, and a third region 13c. A first part 19a of a metal layer 19 is formed on a first region of the semi-insulating InP wafer 81 (in the first region 13a on the second surface 13f of the semiconductor substrate 13), and a second part 19b of the metal layer 19 is formed on a second region of the semi-insulating InP wafer 81 (in the second region 13b on the second surface 13f of the semiconductor substrate 13) through the following steps. As illustrated in FIG. 14A, a mask 105 is formed on the back-surface metal layer 103. By etching the back-surface metal layer 103 using the mask 105, the first part 19a and the second part 19b are formed, as illustrated in FIG. 14B. The first part 19a is spaced from the second part 19b by a gap GAP where the metal layer 19 is not provided. A groove is formed on the back surface of the semiconductor substrate 13 in the gap GAP, and the semi-insulating InP wafer 81 is exposed at the bottom of the groove. Through these steps, a substrate product for the semiconductor optical device 11 was formed. A semiconductor optical device 11 shaped like a semiconductor chip is formed by dividing the substrate product.

As illustrated in FIGS. 15A and 15B, the semiconductor optical device 11 is mounted on a principal surface of a mount substrate 55. Referring to FIG. 15A, the semiconductor optical device 11 and the mount substrate 55 are prepared. The first part 19a of the metal layer 19 in the semiconductor optical device 11 is connected to a metal layer 107b for mounting on the principal surface of the mount substrate 55 by using solder 109b, and the second part 19b of the metal layer 19 in the semiconductor optical device 11 is connected to the metal layer 107b on the principal surface of the mount substrate 55 by using the solder 109b. After mounting, the first part 19a of the metal layer 19 is electrically connected to the second part 19b. Through these steps, a semiconductor assembly is produced. For example, the mount substrate 55 is formed of a ceramic material, and the solder 109b is formed of AuSn.

For example, the back-surface metal layer 103 is isolated as follows. The gold plating layer and the gold sputtering layer are removed by subjecting the gold layer to wet etching using etchant such as iodine-based etchant. After this step, isolation resistance between the two isolated metal layer parts is about several ohms. After wet etching, the platinum layer and the alloy layer (alloy layer of platinum and InP) are removed by ion milling (for example, argon (Ar) milling). Thus, a dug portion (groove) having a depth of about 0.1 μm is formed in the back surface of the semi-insulating InP wafer 81. After this step, the isolation resistance between the two isolated metal layer parts is about several hundred ohms. After milling, the the semi-insulating InP wafer 81 is exposed by removing a milling damage layer by wet etching using an aqueous solution containing hydrochloric acid. After this step, the isolation resistance between the two isolated metal layer parts is about several hundred mega-ohms. Metal does not remain in the isolation groove on the back surface of the semiconductor substrate 13. In terms of measurement of the isolation resistance, the influence of formation of the metal layer on the back surface is eliminated in the gap.

The depth of the groove formed in the back surface of the semi-insulating InP wafer 81 is, for example, about 0.2 μm or more. Thus, the damage layer due to sputtering and milling is removed in a practical level, and the groove reaches the semi-insulating InP. For example, the depth of the groove is 1 μm or less. For example, the width ("DIS" in FIG. 1) of the groove formed in the back surface of the semi-insulating InP wafer 81 is more than or equal to the length of the multi-mode interferometer on the front surface of the semiconductor substrate 13 (length in the direction of the first Ax1). The back-surface metal has an opening that extends from one edge to the other edge of the back surface of the semi-insulating InP wafer 81 so that the width DIS of the groove is more than or equal to the length of the third region 13c (length in the direction of the first axis Ax1). The back-surface metal on the back surface of the semi-insulating InP substrate 81 can have another opening besides the opening aligned with the multi-mode interferometer.

First Example

Next, a first example will be described with reference to FIGS. 16A to 20B. In the description, semiconductor optical devices CP1 to CP5 are referred to. The semiconductor optical devices CP1 to CP5 are manufactured through substantially similar steps except for the difference in the pattern of a back-surface metal, and have substantially the same dimensions except for the difference in the pattern size of the back-surface metal. For example, the size of a semiconductor die for the semiconductor optical devices CP1 to CP5 is 4.2 mm in length and 1.6 mm in width. For example, the lateral width of the die size is 1.0 mm or more. For example, the aspect ratio of the die size is 2.0 or more. Imbalances between channels shown in FIGS. 16B to 20B were measured within the wavelength range of 1520 to 1570 nm.

Semiconductor optical device CP1

Figure 16A:
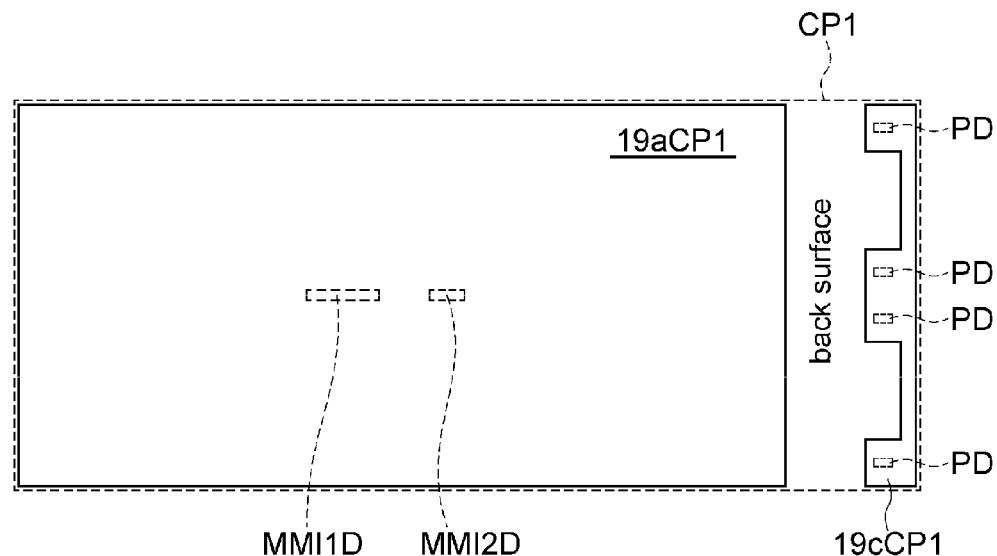
FIG. 16A illustrates a back-surface metal pattern according to a first example.
Figure 16B:
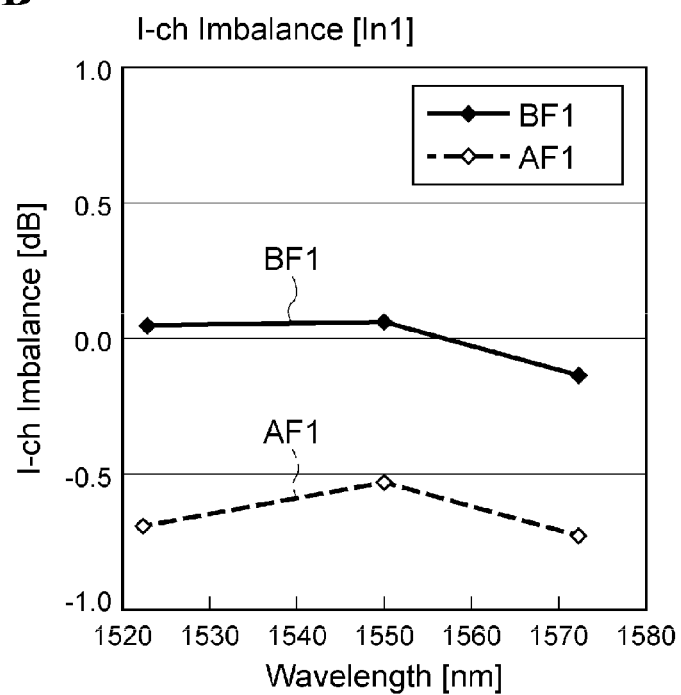
FIG. 16B illustrates the imbalance between channels in a semiconductor optical device of the first example.

According to the findings of the present inventor, the imbalance between channels of a semiconductor optical device CP1 including a multi-mode interferometer MMI1D, a multi-mode interferometer MMI2D, and photodiodes PD to form a coherent receiver is different before and after mounting of the semiconductor optical device CP1. Here, mounting means die-bonding of a semiconductor optical device to a mount substrate with solder. As illustrated in FIG. 16A, the semiconductor optical device CP1 includes back-surface metals 19aCP1 and 19cCP1 provided on back surfaces of a first region 13a, a second region 13b, and a third region 13c. The back-surface metal 19cCP1 is spaced from the back-surface metal 19aCP1, and is provided in an area on the back surface corresponding to the positions (four rectangles shown by broken lines) of the photodiodes PD on the front surface (this also applies to "19cCPn", n=1, 2, 3, 4, 5). FIG. 16B shows the measurement result of imbalance between channels in the semiconductor optical device CP1 of FIG. 16A. Here, the imbalance between channels refers to the largest difference in measured intensity of received light among the four photodiodes PD. In measurement of the imbalance between channels, a desired characteristic is such that the imbalance between channels is equal to zero. As shown in FIG. 16B, an imbalance BF1 between channels of the semiconductor optical device CP1 in an unmounted state is different from an imbalance AF1 between channels of the semiconductor optical device CP1 in a mounted state. Although the imbalance BF1 between channels of the unmounted semiconductor optical device CP1 was matched to the desired characteristic, the imbalance AF1 between channels of the mounted semiconductor optical device CP1 changed by about −0.5 dB in an upward convex form from the imbalance BF1 between channels of the unmounted semiconductor optical device CP1.

Semiconductor Optical Device CP2

Figure 17A:
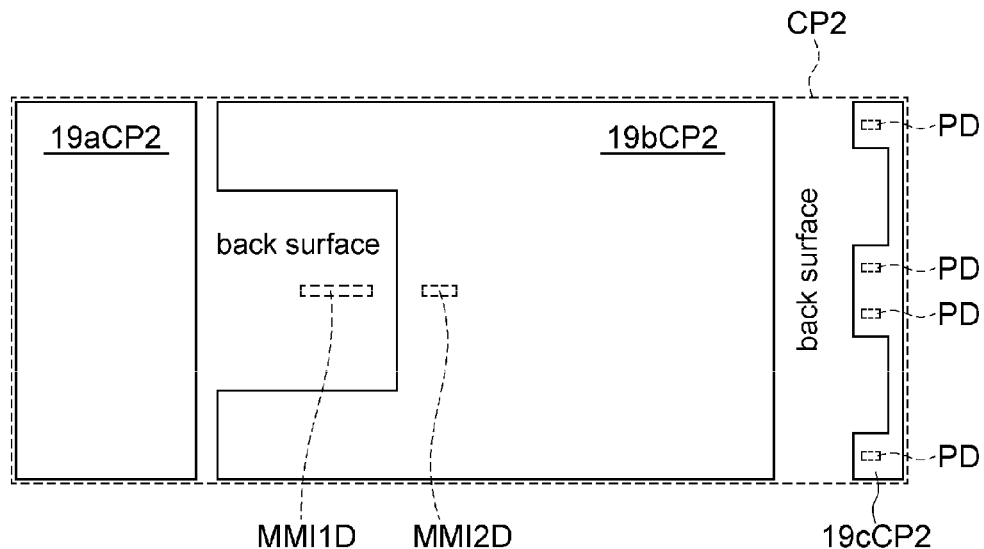
FIG. 17A illustrates a back-surface metal pattern according to the first example.
Figure 17B:
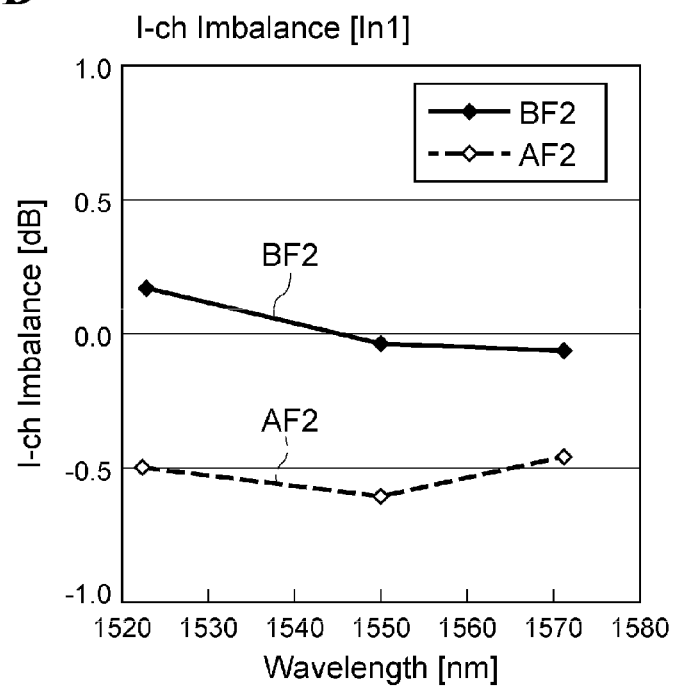
FIG. 17B illustrates the imbalance between channels in a semiconductor optical device of the first example.

As illustrated in FIG. 17A, a semiconductor optical device CP2 includes back-surface metals 19aCP2, 19bCP2, and 19cCP2 in a first region 13a, a second region 13b, and a third region 13c. The back-surface metal 19aCP2 is provided on a back surface of the first region 13a, and the back-surface metal 19bCP2 is provided on back surfaces of the first region 13a, the second region 13b, and the third region 13c to avoid the position of a multi-mode interferometer MMI1D on a front surface and not to avoid the position of a multi-mode interferometer MMI2D. The back-surface metal 19aCP2 is isolated from the back-surface metal 19bCP2 by a stripe opening located in the first region 13a. The back-surface metal 19bCP2 has a pair of wing portions extending along both edges of the back surface of the semiconductor optical device CP2 toward the back-surface metal 19aCP2 in an arrangement direction of the multi-mode interferometer MMI1D and the multi-mode interferometer MMI2D. As shown in FIG. 17B, an imbalance BF2 between channels of the semiconductor optical device CP2 in an unmounted state is different from an imbalance AF2 between channels of the semiconductor optical device CP2 in a mounted state. Although the imbalance BF2 between the channels of the unmounted semiconductor optical device CP2 was matched to a desired characteristic, the imbalance AF2 of the mounted semiconductor optical device CP2 changed by about −0.5 dB in a downward convex form from the imbalance BF2 of the unmounted semiconductor optical device CP2.

Semiconductor Optical Device CP3

Figure 18A:
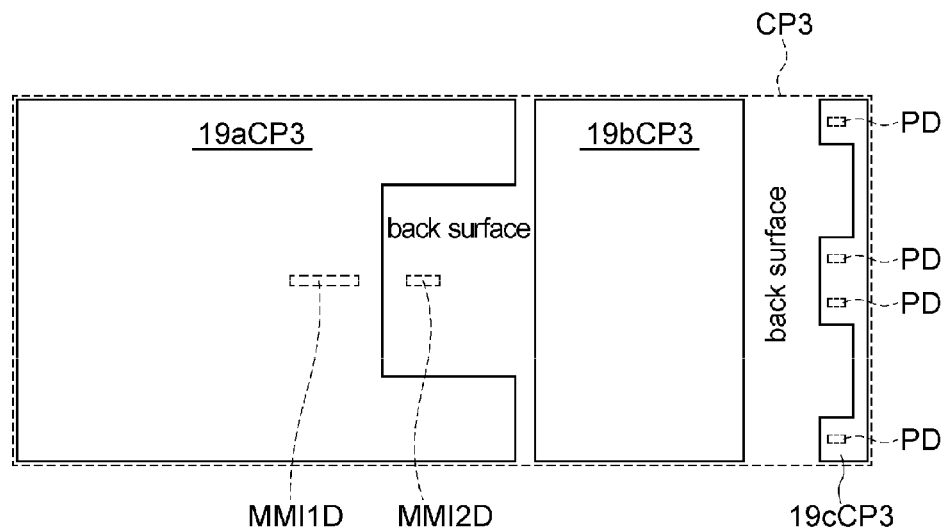
FIG. 18A illustrates a back-surface metal pattern according to the first example.
Figure 18B:
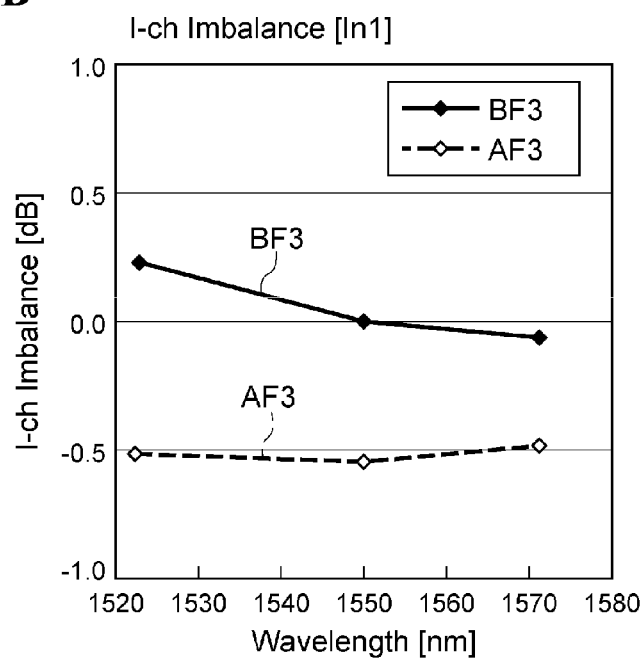
FIG. 18B illustrates the imbalance between channels in a semiconductor optical device of the first example.

As illustrated in FIG. 18A, a semiconductor optical device CP3 includes back-surface metals 19aCP3, 19bCP3, and 19cCP3 provided on back surfaces of a first region 13a, a second region 13b, and a third region 13c. The back-surface metal 19aCP3 is provided on the back surfaces of the first region 13a, the second region 13b, and the third region 13c to avoid the position of a multi-mode interferometer MMI2D on the front surface and not to avoid the position of a multi-mode interferometer MMI1D. The back-surface metal 19bCP3 is provided on the back surface of the second region 13b to avoid the positions of the multi-mode interferometer MMI1D and the multi-mode interferometer MMI2D on the front surface. The back-surface metal 19aCP3 has a pair of wing portions extending along both edges of the back surface of the semiconductor optical device CP3 toward the back-surface metal 19bCP3 in an arrangement direction of the multi-mode interferometer MMI1D and the multi-mode interferometer MMI2D. The back-surface metal 19aCP3 is isolated from the back-surface metal 19bCP3 by a stripe opening located in the second region 13b. As shown in FIG. 18B, an imbalance BF3 between channels of the semiconductor optical device CP3 in an unmounted state is different from an imbalance AF3 between channels of the semiconductor optical device CP3 in a mounted state. Although the imbalance BF3 between channels of the unmounted semiconductor optical device CP3 was matched to a desired characteristic, the imbalance AF3 of the mounted semiconductor optical device CP3 changed by about −0.5 dB in a downward convex form from the imbalance BF3 of the unmounted semiconductor optical device CP3.

Semiconductor Optical Device CP4

Figure 19A:
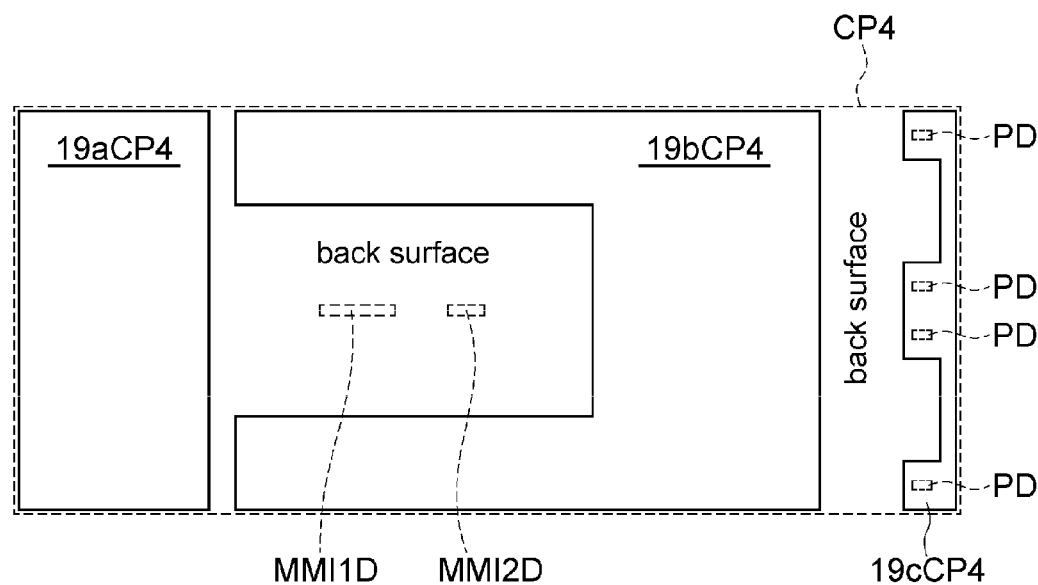
FIG. 19A illustrates a back-surface metal pattern according to the first example.
Figure 19B:
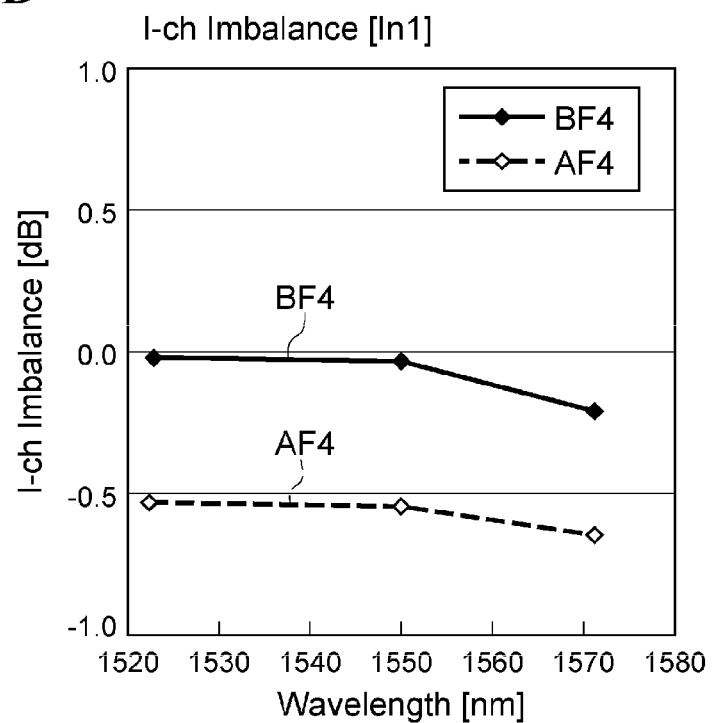
FIG. 19B illustrates the imbalance between channels in a semiconductor optical device of the first example.

As illustrated in FIG. 19A, a semiconductor optical device CP4 includes back-surface metals 19aCP4, 19bCP4, and 19cCP4 provided on back surfaces of a first region 13a, a second region 13b, and a third region 13c. The back-surface metal 19aCP4 is provided on the back surface of the first region 13a to avoid the positions of a multi-mode interferometer MMI1D and a multi-mode interferometer MMI2D on the front surface. The back-surface metal 19bCP4 is provided on the back surfaces of the first region 13a, the second region 13b, and the third region 13c to avoid the positions of the multi-mode interferometer MMI1D and the multi-mode interferometer MMI2D on the front surface. The back-surface metal 19bCP4 has a pair of wing portions extending along both edges of the back surface of the semiconductor optical device CP4 toward the back-surface metal 19aCP4 in an arrangement direction of the multi-mode interferometer MMI1D and the multi-mode interferometer MMI2D. The back-surface metal 19aCP4 is isolated from the back-surface metal 19bCP4 by a stripe opening located in the first region 13a. A part of the back-surface metal 19bCP4 avoids the positions of the multi-mode interferometer MMI1Da and the multi-mode interferometer MMI2D on the front surface. As shown in FIG. 19B, an imbalance BF4 between channels of the semiconductor optical device CP4 in an unmounted state is different from an imbalance AF4 between channels of the semiconductor optical device CP4 in a mounted state. Although the imbalance BF4 between channels of the unmounted semiconductor optical device CP4 was matched to a desired characteristic, the imbalance AF4 between channels of the mounted semiconductor optical device CP4 changed by about −0.5 dB in an upward convex form from the imbalance BF4 of the unmounted semiconductor optical device CP4.

Semiconductor Optical Device CP5

Figure 20A:
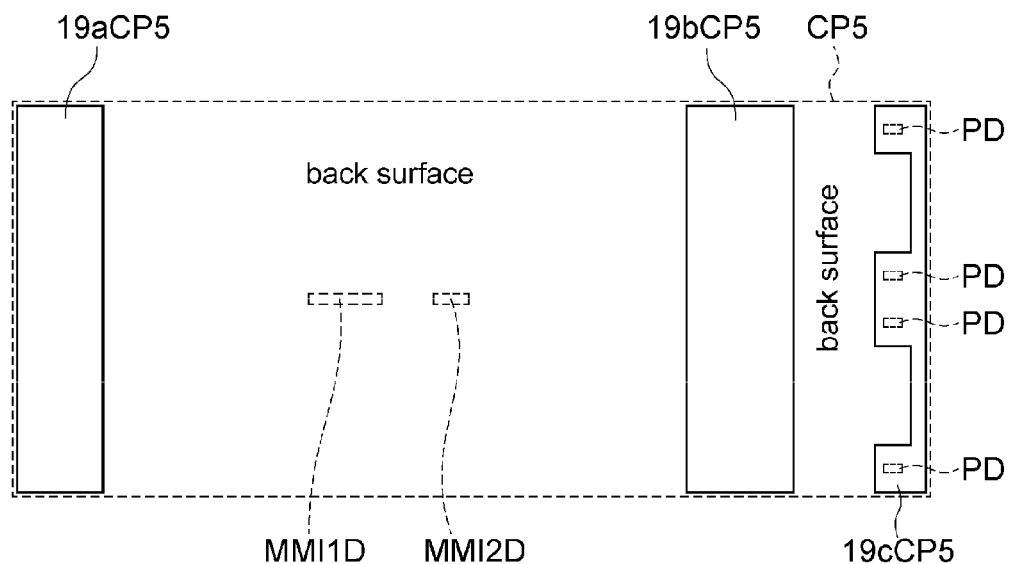
FIG. 20A illustrates a back-surface metal pattern according to the first example.
Figure 20B:
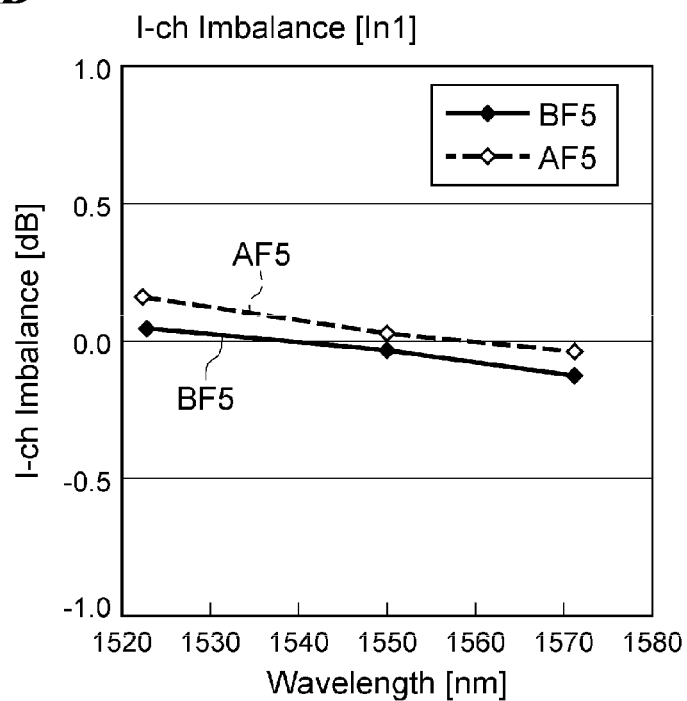
FIG. 20B illustrates the imbalance between channels in a semiconductor optical device of the first example.

As illustrated in FIG. 20A, a semiconductor optical device CP5 includes back-surface metals 19aCP5, 19bCP5, and 19cCP5. The back-surface metal 19aCP5 is provided on a back surface of a first region 13a to avoid the positions of a multi-mode interferometer MMI1D and a multi-mode interferometer MMI2D on a front surface. The back-surface metal 19bCP5 is provided on a back surface of a second region 13b to avoid the positions of the multi-mode interferometer MMI1D and the multi-mode interferometer MMI2D on the front surface. The back-surface metals 19aCP5, 19bCP5, and 19cCP5 are not provided on a back surface of a third region 13c. Neither the back-surface metal 19aCP5 nor the back-surface metal 19bCP5 has a pair of wing portions extending along both edges of a back surface of the semiconductor optical device CP5 in an arrangement direction of of the multi-mode interferometer MMI1D and the multi-mode interferometer MMI2D. The minimum distance between rectangles of broken lines, which show the positions on the back surface corresponding to the positions of the multi-mode interferometer MMI1D and the multi-mode interferometer MMI2D on the front surface, and side edges of the back surface of the semiconductor optical device CP5 is 500 μm as an example. For this reason, a back-surface metal layer is not provided on an area on the back surface within 500 μm in a direction intersecting the arrangement direction of the multi-mode interferometer MMI1D and the multi-mode interferometer MMI2D. As shown in FIG. 20B, an imbalance BF5 between channels of the semiconductor optical device CP5 in an unmounted state is different from an imbalance AF5 between channels of the semiconductor optical device CP5 in a mounted state. The imbalance AF5 between channels of the mounted semiconductor optical device CP5 is different from the imbalances AF1, AF2, AF3, and AF4 between channels of the semiconductor optical devices CP1, CP2, CP3, and CP4 in the point that the imbalance AF5 of the mounted semiconductor optical device CP5 is slightly larger than the imbalance BF5 of the unmounted semiconductor optical device CP5. The imbalance BF5 of the unmounted semiconductor optical device CP5 is matched to a desired characteristic, and the imbalance AF5 of the mounted semiconductor optical device CP5 falls within a desired characteristic range.

Second Example

Figure 21A:
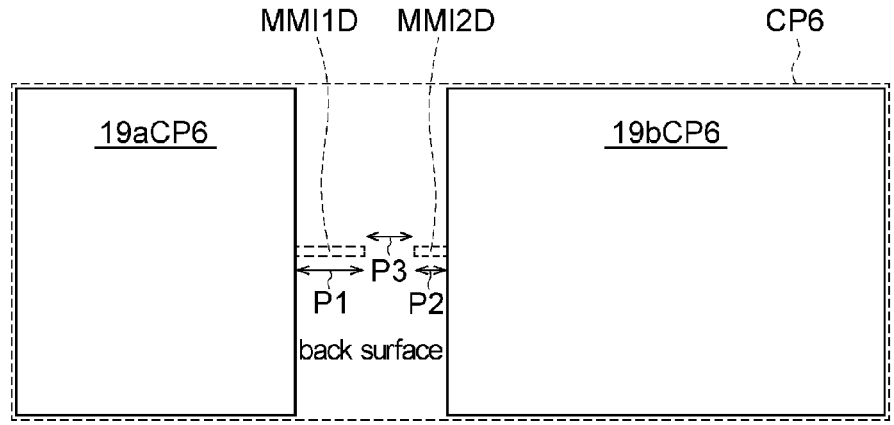
FIG. 21A illustrates a back-surface metal pattern according to a second example.
Figure 21B:
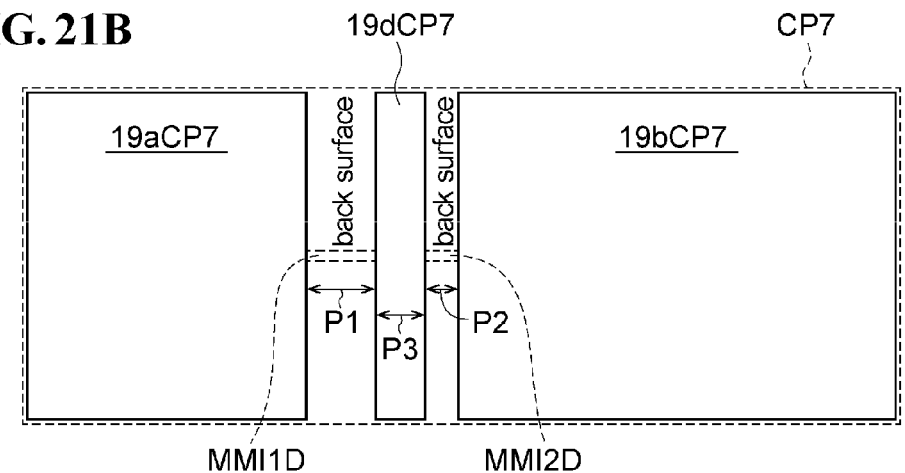
FIG. 21B illustrates a back-surface metal pattern according to the second example.
Figure 21C:
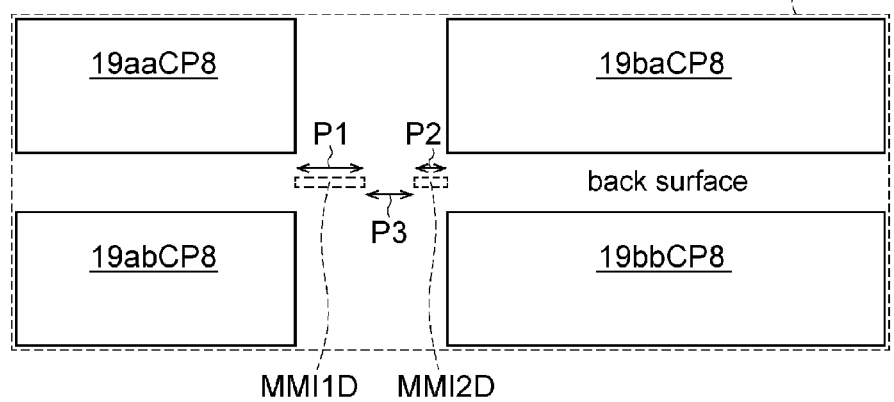
FIG. 21C illustrates a back-surface metal pattern according to the second example.

On further examination based on the relationship between the pattern of the back-surface metals and the difference in imbalance between channels of the semiconductor optical devices CP1 to CP5, in semiconductor optical devices having back-surface metal patterns illustrated in FIGS. 21A to 21C, both the imbalance between channels of the semiconductor optical device in an unmounted state and the imbalance between channels of the semiconductor optical device in a mounted state fall within a predetermined characteristic range. The back-surface metals of the semiconductor optical device CP5 are provided with one or a plurality of stripe-like removal patterns to avoid the back-surface area corresponding to the multi-mode interferometer MMI1D and the multi-mode interferometer MMI2D on the front surface. The multi-mode interferometer MMI1D and the multi-mode interferometer MMI2D are arranged in one direction. Specifically, the substrate region from one end of the multi-mode interferometer MMI1D to the other end of the multi-mode interferometer MMI2D is divided into a first portion P1, a second portion P2, and a third portion P3. The first portion P1, the third portion P3, and the second portion P2 are arranged in this order in the arrangement direction of the multi-mode interferometer MMI1D and the multi-mode interferometer MMI2D. On the back surface, the first portion P1, the second portion P2, and the third portion P3 have stripe shapes in a direction intersecting the arrangement direction of the multi-mode interferometer MMI1D and the multi-mode interferometer MMI2D.

As illustrated in FIG. 21A, an edge of a back-surface metal 19aCP6 can be located apart from an edge of a back-surface metal 19bCP6 by a distance longer than or equal to the distance from one end of a multi-mode interferometer MMI1D to the other end of a multi-mode interferometer MMI2D. This single lateral stripe opening extends in the direction intersecting the arrangement direction of the multi-mode interferometer MMI1D and the multi-mode interferometer MMI2D. Specifically, the multi-mode interferometer MMI1D is located on a first portion P1, and the multi-mode interferometer MMI2D is located on a second portion P2. The lateral stripe opening is located on the first portion P1, the second portion P2, and a third portion P3.

As illustrated in FIG. 21B, an edge of a back-surface metal 19aCP7 is located apart from an edge of a back-surface metal 19bCP7 by a distance longer than or equal to the distance from one end of a multi-mode interferometer MMI1D to the other end of a multi-mode interferometer MMI2D. A back-surface metal 19dCP7 is provided on an area of the back surface corresponding to an area on the front surface from the other end of the multi-mode interferometer MMI1D to one end of the multi-mode interferometer MMI2D. The three back-surface metals 19aCP7, 19bCP7, and 19dCP7 are provided to avoid the areas on the back surface corresponding to the multi-mode interferometer MMI1D and the multi-mode interferometer MMI2D on the front surface. The back-surface metals 19aCP7, 19bCP7, and 19dCP7 are isolated by two lateral stripe openings. These lateral stripe openings extend in the direction intersecting the arrangement direction of the multi-mode interferometer MMI1D and the multi-mode interferometer MMI2D. Specifically, the lateral stripe openings are located on a first portion P1 and a second portion P2, and the back-surface metal 19dCP7 is located on a third portion P3.

As illustrated in FIG. 21C, the single lateral stripe opening illustrated in FIG. 21A can be combined with one or a plurality of longitudinal stripe openings extending in the arrangement direction of the multi-mode interferometer MMI1D and the multi-mode interferometer MMI2D. In a specific example, back-surface metals 19aaCP8, 19abCP8, 19baCP8, and 19bbCP8 are spaced by a single longitudinal stripe opening and a single lateral stripe opening. Specifically, the single longitudinal stripe opening crosses a section from a first portion P1 to a second portion P2.

Alternatively, the plurality of lateral stripe openings illustrated in FIG. 21B can be combined with one or a plurality of longitudinal stripe openings extending in the arrangement direction of the multi-mode interferometer MMI1D and the multi-mode interferometer MMI2D. As described above, the back-surface metal can have various patterns that can reduce the change in characteristics due to imbalance.

Principles of the present invention have been described on the basis of the preferred embodiments with reference to the drawings. However, it is understood by those skilled in the art that changes may be made in the present invention in terms of arrangements and details without departing from such principles. The present invention is not limited to the specific configurations disclosed in the embodiments. Therefore, the right to make any changes and modifications on the basis of the scope and the spirit of the claims may be demanded.

What is claimed is:

1. A semiconductor optical device comprising:
a semiconductor substrate having a first side edge and a second side edge extending in a direction of a first axis and including a first region, a second region, a third region, and a fourth region;
a 90-degree optical hybrid provided in the third region on a principal surface of the semiconductor substrate;
a first waveguide optically coupled to a first port of the 90-degree optical hybrid and provided in the first region on the principal surface of the semiconductor substrate;
a second waveguide optically coupled to a second port of the 90-degree optical hybrid and provided in the first region on the principal surface of the semiconductor substrate;
a photodiode provided in the fourth region on the principal surface of the semiconductor substrate;
a third waveguide provided in the second region on the principal surface of the semiconductor substrate to optically couple a third port of the 90-degree optical hybrid to the photodiode; and
a metal layer provided on a back surface of the semiconductor substrate and including a first part and a second part spaced from each other by a distance,
wherein the first region, the third region, the second region, and the fourth region are arranged in this order in the direction of the first axis,
wherein the first part of the metal layer is provided in the first region on the back surface of the semiconductor substrate,
wherein the second part of the metal layer is provided in the second region on the back surface of the semiconductor substrate,
wherein the 90-degree optical hybrid has a first length defined in the direction of the first axis on the principal surface of the semiconductor substrate,
wherein the third region of the semiconductor substrate extends from the first side edge to the second side edge of the semiconductor substrate in a direction of a second axis intersecting the first axis, and the third region of the semiconductor substrate has a length defined in the direction of the first axis equal to the first length, and
wherein the distance between the first part and the second part is more than or equal to the first length.

2. The semiconductor optical device according to claim 1, wherein the first part of the metal layer has a portion extending from the first side edge to the second side edge of the semiconductor substrate in the direction of the second axis.

3. The semiconductor optical device according to claim 1, wherein the second part of the metal layer has a portion extending from the first side edge to the second side edge of the semiconductor substrate in the direction of the second axis.

4. The semiconductor optical device according to claim 1, wherein the 90-degree optical hybrid includes a first multi-mode interferometer and a second multi-mode interferometer, the first multi-mode interferometer is connected to the first waveguide and the second waveguide, the second multi-mode interferometer is connected to the third waveguide, and the first multi-mode interferometer and the second multi-mode interferometer are provided in the third region.

5. The semiconductor optical device according to claim 4, wherein the 90-degree optical hybrid further includes a fourth waveguide provided in the third region to optically couple the first multi-mode interferometer and the second multi-mode interferometer, and the first multi-mode interferometer, the fourth waveguide, and the second multi-mode interferometer are arranged in order in the direction of the first axis, and
wherein the metal layer further includes a third part spaced from the first part and the second part and provided on a back surface of the fourth waveguide, and the third part is located between the first part and the second part on the back surface of the semiconductor substrate.

6. The semiconductor optical device according to claim 5, wherein the third part of the metal layer has a portion extending from the first side edge to the second side edge of the semiconductor substrate in the direction of the second axis.

7. The semiconductor optical device according to claim 1, wherein the first part of the metal layer has a first opening extending in the direction of the first axis, and
wherein the back surface of the semiconductor substrate is exposed in the opening.

8. The semiconductor optical device according to claim 7, wherein the second part of the metal layer has a second opening extending in the direction of the first axis,
wherein the back surface of the semiconductor substrate is exposed in the openings,
wherein the 90-degree optical hybrid has a first width defined in the direction of the second axis on the principal surface of the semiconductor substrate, and
each of the first opening and the second opening has a width larger than the first width.

9. A semiconductor assembly comprising:
a semiconductor optical device including a semiconductor substrate having first to fourth regions, a 90-degree optical hybrid provided in the third region on a principal surface of the semiconductor substrate, first and second waveguides provided in the first region on the principal surface of the semiconductor substrate and optically coupled to the 90-degree optical hybrid, a photodiode provided in the fourth region on the principal surface of the semiconductor substrate, a third waveguide provided in the second region on the principal surface of the semiconductor substrate to optically couple a port of the 90-degree optical hybrid to the photodiode, and a metal layer provided on a back surface of the semiconductor substrate and including a first part and a second part spaced from each other by a distance larger than a length of the 90-degree optical hybrid;
a mount substrate having a mount surface and a metal film provided on the mount surface; and
a bonding member that bonds the semiconductor optical device to the metal film of the mount substrate.

* * * * *